(12) United States Patent
Shin et al.

(10) Patent No.: US 12,562,747 B2
(45) Date of Patent: Feb. 24, 2026

(54) ANALOG-TO-DIGITAL CONVERTER AND OFFSET CORRECTION METHOD THEREOF

(71) Applicant: SAMSUNG ELECTRONICS CO., LTD., Suwon-si (KR)

(72) Inventors: Heewook Shin, Suwon-si (KR); Jaehyuk Lee, Seoul-si (KR); Junho Boo, Seoul-si (KR); Seunghoon Lee, Seoul-si (KR); Youngjae Cho, Suwon-si (KR); Michael Choi, Suwon-si (KR); Jinwook Burm, Seoul-si (KR); Gilcho Ahn, Seoul-si (KR)

(73) Assignees: Samsung Electronics Co., Ltd., Suwon-si (KR); Sogang University Research Foundation, Seoul (KR)

( * ) Notice: Subject to any disclaimer, the term of this patent is extended or adjusted under 35 U.S.C. 154(b) by 106 days.

(21) Appl. No.: 18/666,180

(22) Filed: May 16, 2024

(65) Prior Publication Data

US 2025/0030430 A1 Jan. 23, 2025

(30) Foreign Application Priority Data

Jul. 19, 2023 (KR) ........................ 10-2023-0093957
Aug. 21, 2023 (KR) ........................ 10-2023-0109344

(51) Int. Cl.
 *H03M 1/06* (2006.01)
 *H03M 1/10* (2006.01)
 *H03M 1/46* (2006.01)
(52) U.S. Cl.
 CPC ....... *H03M 1/0607* (2013.01); *H03M 1/1023* (2013.01); *H03M 1/468* (2013.01)
(58) Field of Classification Search
 CPC ... H03M 1/0607; H03M 1/1023; H03M 1/468
 See application file for complete search history.

(56) References Cited

U.S. PATENT DOCUMENTS 6,163,291 A * 12/2000 Uchino .................... H03M 1/06
 341/163
8,854,240 B2 * 10/2014 Chen ....................... H03M 1/06
 341/130
(Continued)

FOREIGN PATENT DOCUMENTS

CN 105141313 12/2015
CN 106067817 11/2016
(Continued)

OTHER PUBLICATIONS

Lee, et al., "11 b 200 MS/s 28-nm CMOS 2b/cycle successive-approximation register analogue-to-digital converter using offset-mismatch calibrated comparators", Aug. 26, 2023, found on the internet at https://doi.org/10.1049/ell2.12929, 3 pages.

*Primary Examiner* — Khai M Nguyen
(74) *Attorney, Agent, or Firm* — Morgan, Lewis & Bockius LLP

(57) ABSTRACT

Provided is an analog-to-digital converter and a voltage offset correction method thereof. The analog-to-digital converter may include a digital-to-analog converter (DAC) configured to generate a first comparison voltage, a comparison circuit configured to output a first comparison result signal based on a result of comparing the first comparison voltage with a second comparison voltage, and a control circuit configured to control the DAC and output an output signal, wherein the DAC may include a correction circuit configured to generate a correction voltage by selectively switching switches connected to terminals to which a plurality of reference voltages are applied, and correct a voltage offset of the comparison circuit based on the correction voltage.

20 Claims, 17 Drawing Sheets

(56)     References Cited

U.S. PATENT DOCUMENTS

|  |  |  |  |
|---|---|---|---|
| 9,467,161 | B1 | 10/2016 | Kim et al. |
| 9,966,967 | B2 | 5/2018 | Xu et al. |
| 10,581,443 | B2 | 3/2020 | Vinje et al. |
| 10,601,433 | B2 | 3/2020 | Zare et al. |
| 2022/0209780 | A1 | 6/2022 | Sharma et al. |

FOREIGN PATENT DOCUMENTS

|  |  |  |  |
|---|---|---|---|
| CN | 113922819 |  | 4/2022 |
| KR | 10-1341642 |  | 12/2013 |
| KR | 10-1670440 |  | 10/2016 |
| KR | 10-2090205 |  | 3/2020 |
| KR | 10-2020-0077504 |  | 6/2020 |
| KR | 10-2022-0109123 | A | 8/2022 |
| KR | 10-2022-0142686 |  | 10/2022 |

* cited by examiner

FIG.  4A

| THERMOMETER CODE | | | 2-BIT CODE |
|---|---|---|---|
| CRS3 | CRS2 | CRS1 | |
| 1 | 1 | 1 | 11 |
| 0 | 1 | 1 | 10 |
| 0 | 0 | 1 | 01 |
| 0 | 0 | 0 | 00 |

ANALOG-TO-DIGITAL CONVERTER AND OFFSET CORRECTION METHOD THEREOF

CROSS-REFERENCE TO RELATED APPLICATIONS

This application is based on and claims priority under 35 U.S.C. § 119 to Korean Patent Application Nos. 10-2023-0093957, filed on Jul. 19, 2023, and 10-2023-0109344, filed on Aug. 21, 2023, in the Korean Intellectual Property Office, the disclosures of which are incorporated by reference herein in their entireties.

TECHNICAL FIELD

This disclosure relates to an analog-to-digital converter, and more particularly, to a successive approximation register (SAR) analog-to-digital converter (ADC) and an offset correction method thereof.

DISCUSSION OF RELATED ART

Research on the SAR ADC that operates based on digital circuits is actively underway. The ADC may include comparison circuits. Due to errors in the semiconductor process, mismatch may occur between transistors included in the comparison circuits. This mismatch may cause a voltage offset in an input voltage of each comparison circuit, and the voltage offset may cause errors in an output value of the comparison circuit. Accuracy in converting analog signals to digital signals may be degraded due to the errors. Accordingly, a voltage offset correction method is desirable.

SUMMARY

Embodiments of the inventive concept provide a voltage offset correction method of an analog-to-digital converter.

According to an aspect of the inventive concept, there is provided an analog-to-digital converter (ADC) including a digital-to-analog converter (DAC) configured to generate a first comparison voltage based on an input signal, a common mode voltage, a plurality of reference voltages, and a control signal, a comparison circuit configured to output a first comparison result signal based on a result of comparing the first comparison voltage with a second comparison voltage applied to a terminal different from the first comparison voltage, and a control circuit configured to generate the control signal, control the DAC based on the first comparison result signal, and output an output signal, wherein the DAC may include a correction circuit configured to generate a correction voltage by selectively switching switches connected to terminals to which the plurality of reference voltages are applied, based on a result of applying the common mode voltage to the comparison circuit, and to correct a voltage offset of the comparison circuit based on the correction voltage.

According to another aspect of the inventive concept, there is provided an offset correction method of an ADC, the method including setting the ADC to operate in correction mode, applying a common mode voltage, which is a first comparison voltage, to a first terminal of the comparison circuit, generating a control bit based on a result of the comparison circuit comparing a first comparison voltage with a second comparison voltage applied to a second terminal of the comparison circuit, based on a value of the control bit, determining reference voltages to be applied to a correction circuit among a plurality of reference voltages, generating a correction voltage based on the determined reference voltages, and correcting a voltage offset of the comparison circuit by adding the correction voltage to the first comparison voltage.

According to another aspect of the inventive concept, there is provided an ADC including a first DAC configured to generate a first comparison voltage based on an input signal, a common mode voltage, a plurality of reference voltages, and a control signal, a second DAC configured to generate a second comparison voltage based on the common mode voltage, the plurality of reference voltages, and the control signal, a third DAC configured to generate a third comparison voltage based on the common mode voltage, the plurality of reference voltages, and the control signal, a first comparison circuit configured to output a first comparison result signal based on a result of comparing the first comparison voltage with the second comparison voltage applied to a terminal different from the first comparison voltage, a second comparison circuit configured to output a second comparison result signal based on a result of comparing the first comparison voltage with a fourth comparison voltage applied to a terminal different from the first comparison voltage, and a third comparison circuit configured to output a third comparison result signal based on a result of comparing the first comparison voltage with the third comparison voltage applied to a terminal different from the first comparison voltage, wherein the first DAC may include a first correction circuit configured to correct voltage offsets of the first comparison circuit, the second comparison circuit, and the third comparison circuit based on a result of applying the common mode voltage to the first comparison circuit, the second DAC may include a second correction circuit configured to correct the offset of the second comparison circuit based on a result of applying the common mode voltage to the first comparison circuit, and the third DAC may include a third correction circuit configured to correct the voltage offset of the third comparison circuit based on a result of applying the common mode voltage to the third comparison circuit.

BRIEF DESCRIPTION OF THE DRAWINGS

Embodiments will be more clearly understood from the following detailed description taken in conjunction with the accompanying drawings in which:

FIGS. 4A, 4B and 4C are diagrams illustrating the operation of an analog-to-digital converter according to an embodiment;

DETAILED DESCRIPTION OF EMBODIMENTS

Figure 1:
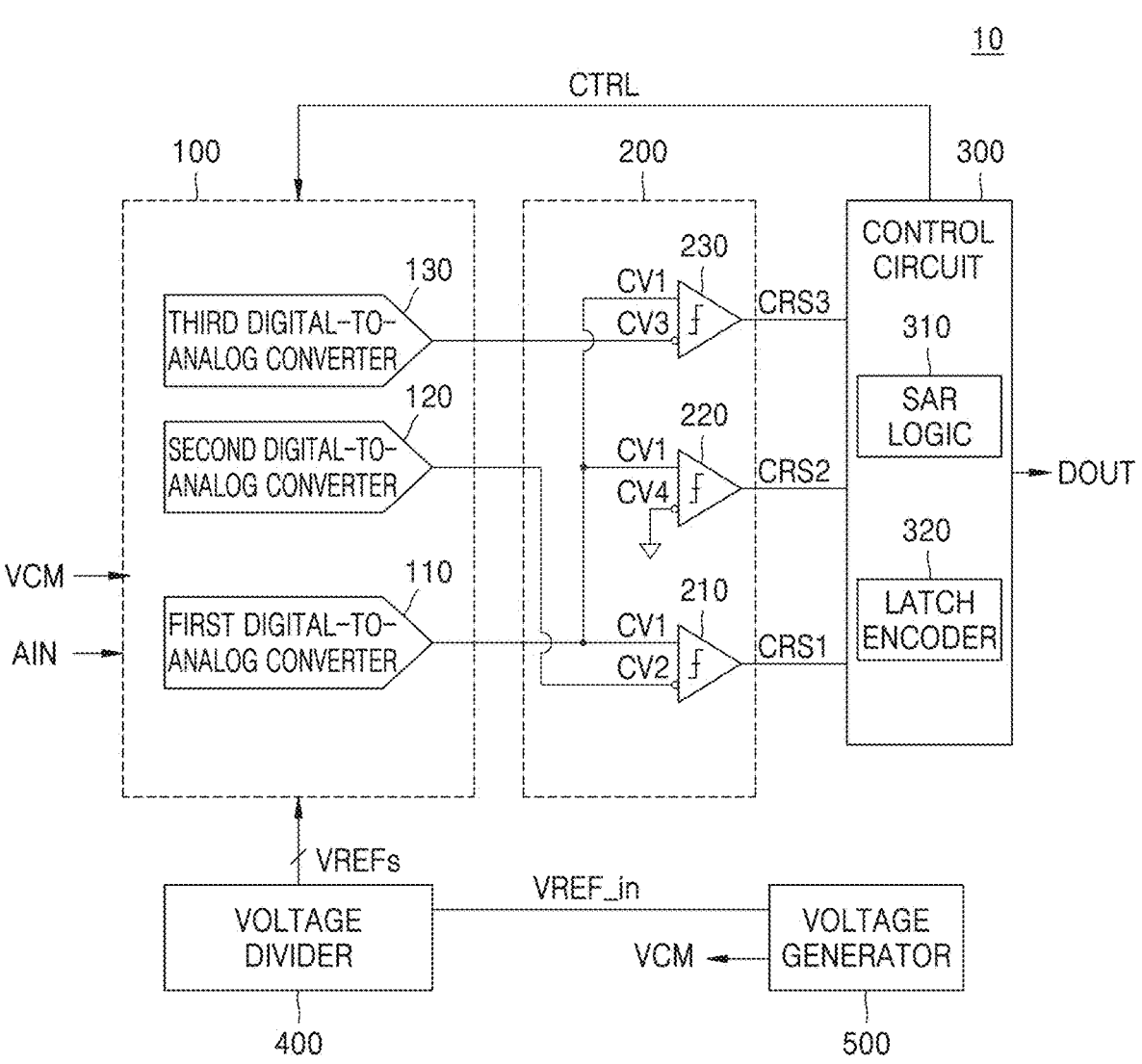
FIG. 1 is a diagram of an analog-to-digital converter according to an embodiment.

Hereinafter, embodiments will be described in detail with reference to the attached drawings. When describing with reference to the drawings, identical or corresponding components are given the same reference numerals and redundant descriptions thereof may be omitted.

FIG. 1 is a diagram of an analog-to-digital converter (ADC) 10 according to an embodiment.

Referring to FIG. 1, the ADC 10 may convert an input signal AIN to an output signal DOUT based on a common mode voltage VCM and a plurality of reference voltages VREFs. The input signal AIN may be an analog signal, and the output signal DOUT may be a digital signal including a plurality of bits. The ADC 10 may be a differential ADC. In other words, the ADC 10 may receive a differential signal as an input signal (the input signal AIN may be a differential signal).

The ADC 10 may include a digital-to-analog conversion unit 100, a voltage comparison unit 200, a control circuit 300, a voltage divider 400, and a voltage generator 500.

The digital-to-analog conversion unit 100 may include a first digital-to-analog converter (DAC) 110, a second DAC 120, and a third DAC 130. The digital-to-analog conversion unit 100 may receive the input signal AIN from an external source. The digital-to-analog conversion unit 100 may receive the common mode voltage VCM from the voltage generator 500. The digital-to-analog conversion unit 100 may receive the plurality of reference voltages VREFs from the voltage divider 400.

The first DAC 110 may generate a first comparison voltage CV1 based on the input signal AIN, the common mode voltage VCM, and the plurality of reference voltages VREFs. The first DAC 110 may sample the input signal AIN. The first DAC 110 may adjust a sampling value of the input signal AIN by increasing or decreasing the sampling value thereof. The first DAC 110 may provide the first comparison voltage CV1 generated based on the input signal AIN to a first comparison circuit 210, a second comparison circuit 220, and a third comparison circuit 230. Herein, the first DAC 110 may be referred to as a "signal DAC" ("SIG-DAC"). The first DAC 110 may generate a first correction voltage for correcting a voltage offset (hereafter, "offset") occurring in the first comparison circuit 210, the second comparison circuit 220, and the third comparison circuit 230.

The second DAC 120 may generate a second comparison voltage CV2 based on the common mode voltage VCM and the plurality of reference voltages VREFs. The second DAC 120 may provide the second comparison voltage CV2 to the first comparison circuit 210. Herein, the second DAC 120 may be referred to as a "first reference DAC" ("first REF-DAC"). The second DAC 120 may generate a voltage as a reference for comparison in adjusting the sampling value of the input signal AIN. The second DAC 110 may generate a second correction voltage for correcting an offset occurring in the first comparison circuit 210.

The third DAC 130 may generate a third comparison voltage CV3 based on the common mode voltage VCM and the plurality of reference voltages VREFs. The third DAC 130 may provide the third comparison voltage CV3 to the third comparison circuit 230. The third DAC 130 may be referred to as a second reference DAC ("second REF-DAC"). The third DAC 130 may generate a voltage as a reference for comparison in adjusting the sampling value of the input signal AIN. The third DAC 130 may generate a third correction voltage for correcting an offset occurring in the third comparison circuit 230.

The first DAC 110, the second DAC 120, and the third DAC 130 may be differential DACs. Herein, the first DAC 110, the second DAC 120, and the third DAC 130 may be shown in the form of a half DAC.

The voltage comparison unit 200 may include the first comparison circuit 210, the second comparison circuit 220, and the third comparison circuit 230. The first comparison voltage CV1 may be applied to a first terminal of the first comparison circuit 210, and the second comparison voltage CV2 may be applied to a second terminal thereof. The first comparison circuit 210 may compare the first comparison voltage CV1 with the second comparison voltage CV2, and may output a first comparison result signal CRS1 based on the comparison result. When the first comparison voltage CV1 equals or exceeds the second comparison voltage CV2, the first comparison result signal CRS1 may be (or include) a logic "1" (have a logic 1 voltage level). When the first comparison voltage CV1 is less than the second comparison voltage CV2, the first comparison result signal CRS1 may be (or include) a logic "0". Hereinafter, "1" may be referred to as a first value, and "0" may be referred to as a second value. The first comparison result signal CRS1 may be (or include) a control bit.

The first comparison voltage CV1 may be applied to a first terminal of the second comparison circuit 220, and a fourth comparison voltage CV4 may be applied to a second terminal thereof. The second comparison circuit 220 may compare the first comparison voltage CV1 with the fourth comparison voltage CV4, and may output a second comparison result signal CRS2 based on the comparison result. The terminal of the second comparison circuit 220 to which the fourth comparison voltage CV4 is applied may be AC grounded. For example, the fourth comparison voltage CV4 may be 0 V. Additionally, for example, the fourth comparison voltage CV4 may be the common mode voltage VCM. When the first comparison voltage CV1 equals or exceeds the fourth comparison voltage CV4, the second comparison result signal CRS2 may be (or include) "1". When the first comparison voltage CV1 is less than the fourth comparison voltage CV4, the second comparison result signal CRS2 may be (or include) "0". The second comparison result signal CRS2 may be (or include) a control bit.

The third comparison circuit 230 may compare the first comparison voltage CV1 with the third comparison voltage CV3, and may output a third comparison result signal CRS3 based on the comparison result. When the first comparison voltage CV1 equals or exceeds the third comparison voltage CV3, the third comparison result signal CRS3 may be or include "1". When the first comparison voltage CV1 is less than the third comparison voltage CV3, the third comparison result signal CRS3 may be (or include) "0". The third comparison result signal CRS3 may be (or include) a control bit.

The first comparison result signal CRS1, the second comparison result signal CRS2, and the third comparison result signal CRS3 may be provided to the control circuit 300 in the form of a thermometer code. (A thermometer code may be a sequence of 0's (one or more 0's) followed by a sequence of 1's (one or more 1's), or vice versa. In another example, a thermometer code is a code of all 1's or all 0's.) The thermometer code is described below with reference to FIGS. 4A to 4C.

The first comparison circuit 210, the second comparison circuit 220, and the third comparison circuit 230 may each have a voltage offset. The offset of each comparison circuit may be caused by a mismatch in the sizes of transistors included in the comparison circuit during the semiconductor manufacturing process. The offset of each comparison circuit may be different depending on the characteristics of semiconductor chips including the comparison circuit. When the sizes of the transistors included in the comparison circuit do not match, a value of current flowing through an output terminal of the comparison circuit may vary, thereby decreasing the accuracy of the output value of the comparison circuit. The offset of each comparison circuit may be corrected by the correction voltage generated by the first DAC 110, the second DAC 120, and the third DAC 130.

The control circuit 300 may include a successive approximation register (SAR) logic 310 and a latch encoder 320. The control circuit 300 may receive a clock signal from an external circuit. The SAR logic 310 may operate based on the received clock signal. The SAR logic 310 may generate an internal clock signal based on the received clock signal. The SAR logic 310 may generate a control signal CTRL based on the comparison result signal received by the control circuit 300. The SAR logic 310 may control the first to third DACs 110, 120, and 130 through the control signal CTRL. The latch encoder 320 may convert the thermometer code generated based on the first comparison result signal CRS1, the second comparison result signal CRS2, and the third comparison result signal CRS3 into a 2-bit code.

The voltage divider 400 may receive an input reference voltage VREF_in from the voltage generator 500. The voltage divider 400 may include a plurality of resistors. The voltage divider 400 may generate the plurality of reference voltages VREFs based on the input reference voltage VREF_in. Herein, the voltage divider 400 may be referred to as a resistor string (r-string). The input reference voltage VREF_in may include a positive input reference voltage and a negative input reference voltage.

The plurality of reference voltages VREFs may include M reference voltages configured to sequentially decrease in voltage magnitude, where M is an integer of two or more. For instance, the plurality of reference voltages VREFs may include first to $M^{th}$ positive reference voltages, which are configured to sequentially decrease. The first to $M^{th}$ positive reference voltages may be configured to sequentially decrease by an exponential number of 2.

The plurality of reference voltages VREFs may include M reference voltages configured to sequentially decrease in voltage magnitude. For instance, the plurality of reference voltages VREFs may include first to $M^{th}$ negative reference voltages, which may be configured to sequentially decrease. The first to $M^{th}$ negative reference voltages may be configured to sequentially decrease by an exponential number of 2.

By generating various reference voltages through the voltage divider 400, the number of unit capacitors may be reduced. For example, assuming that the plurality of reference voltages VREFs are applied to capacitors included in the DACs through only the input reference voltage VREF_in without the voltage divider 400, voltages corresponding to the plurality of reference voltages VREFs may be generated by adjusting the capacitance of the capacitors. To generate the voltages corresponding to the plurality of reference voltages VREFs, the capacitance of the capacitors are diversified. When the capacitance of the capacitors increases, the number of unit capacitors may increase, thereby increasing the area of the ADC 10. However, assuming that the plurality of reference voltages VREFs are generated through the voltage divider 400, the voltages corresponding to the plurality of reference voltages VREFs may be generated even with a capacitor having a less capacitance, depending on the magnitude of the reference voltage generated through the voltage divider 400. Therefore, the area of the ADC 10 may be reduced.

The voltage generator 500 may receive power from an external source. The voltage generator 500 may provide the input reference voltage VREF_in to the voltage divider 400. The voltage generator 500 may provide the common mode voltage VCM to the digital-to-analog conversion unit 100.

The ADC 10 may be a successive approximation register ADC (SAR ADC). The ADC 10 may be a 2-bit/cycle SAR ADC that performs a 2-bit conversion operation for one cycle. The one cycle may refer to a cycle of the internal clock signal generated by the control circuit 300 based on an external clock signal received from the outside. For example, when seven cycles of the internal clock signal are generated during one cycle of the external clock signal, the ADC 10 may perform a conversion operation for seven cycles. In other words, the ADC 10 may perform seven conversion operations on the sampling value of the input signal AIN. As the ADC 10 performs seven conversion operations, the sampling value of the input signal AIN may be converted into a 14-bit digital value.

The ADC 10 may operate in either correction mode or normal mode. When the ADC 10 performs its first operation or when it is determined that offset correction is desirable, the ADC 10 may operate in correction mode. When the ADC 10 operates in correction mode, the ADC 10 may generate a correction voltage based on the common mode voltage VCM and the plurality of reference voltages VREFs through a correction circuit, thereby correcting an offset generated in the voltage comparison unit 200.

When the ADC 10 completes offset correction, the ADC 10 may operate in normal mode. When the ADC 10 operates in normal mode, the ADC 10 may convert the input signal AIN into the output signal DOUT. The voltage comparison unit 200 may perform an operation of comparing comparison voltages respectively applied to comparison circuits while the offset is corrected through the correction voltage generated in correction mode.

Figure 2A:
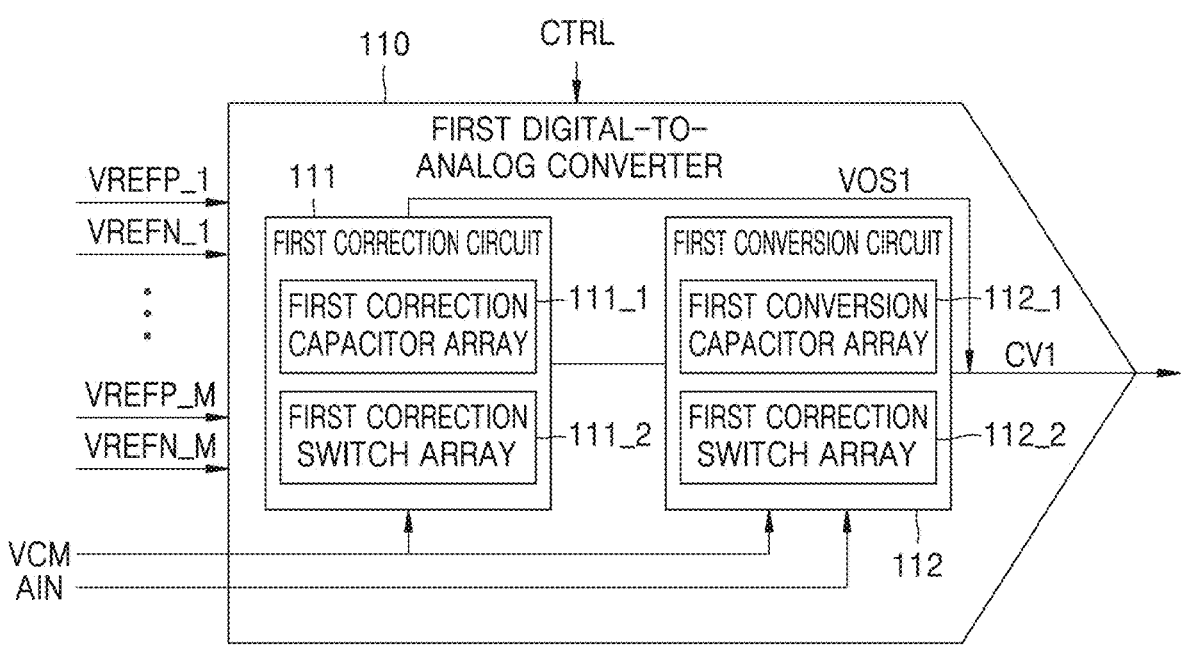
FIGS. 2A, 2B and 2C are diagrams of DACs according to an embodiment.
Figure 2B:
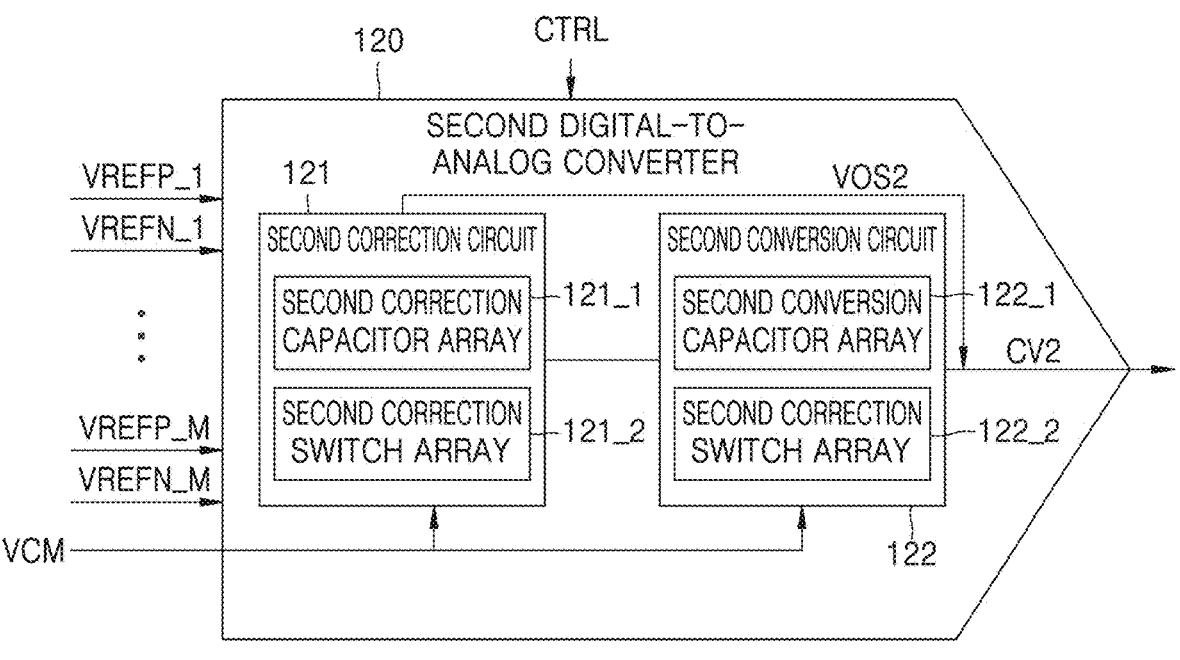
Figure 2C:
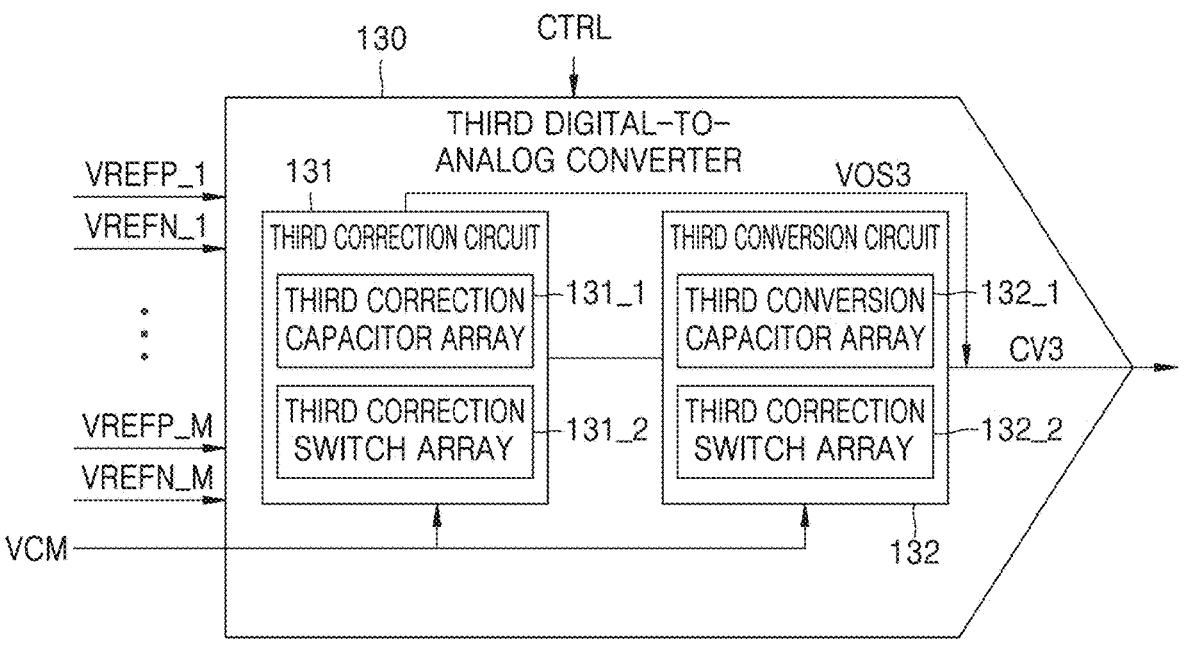

FIGS. 2A to 2C are diagrams of DACs according to an embodiment. Specifically, FIG. 2A is a diagram of the first DAC 110 generating a first correction voltage VOS1 and a first comparison voltage CV1. FIG. 2B is a diagram of the second DAC 120 generating a second correction voltage VOS2 and a second comparison voltage CV2. FIG. 2C is a diagram of the third DAC 130 generating a third correction voltage VOS3 and a third comparison voltage CV3. FIGS. 2A to 2C may be described with reference to FIG. 1, and redundant descriptions may be omitted.

Referring to FIG. 2A, the first DAC 110 according to an embodiment may receive the plurality of reference voltages VREFs from the voltage divider 400. The plurality of reference voltages VREFs may include first to $M^{th}$ positive reference voltages VREFP_1 to VREFP_M and first to $M^{th}$ negative reference voltages VREFN_1 to VREFN_M. The voltage generator 500 may provide the common mode voltage VCM to the first DAC 110. The input signal AIN may be provided to the first DAC 110 from the outside.

The first DAC 110 may include a first correction circuit 111 and a first conversion circuit 112. The first correction circuit 111 may generate the first correction voltage VOS1. The first correction circuit 111 may correct an offset of the voltage comparison unit 200 through the first correction voltage VOS1. The first correction circuit 111 may add the first correction voltage VOS1 to the first comparison voltage CV1. That is, the first correction circuit 111 may adjust the first comparison voltage CV1 through the first correction voltage VOS1.

The first correction circuit 111 may include a first correction capacitor array 111_1 and a first correction switch array 111_2. The first correction capacitor array 111_1 may include a plurality of capacitors. The first correction capacitor array 111_1 may include N capacitors (N is an integer of 2 or more, for all cases discussed hereafter). In this case, the correction voltage generated by the first correction circuit 111 may correspond to an N-bit digital value.

The first correction switch array 111_2 may include a plurality of switches. The first correction circuit 111 may control the operation of the switches included in the first correction switch array 111_2 based on the control signal CTRL of the control circuit 300, and may select reference voltages supplied to the first correction capacitor array 111_1. By applying the selected reference voltages to the first correction capacitor array 111_1, the first correction circuit 111 may generate the first correction voltage VOS1.

The first conversion circuit 112 may generate the first comparison voltage CV1 based on the input signal AIN, the common mode voltage VCM, and the plurality of reference voltages VREFP_1 to VREFP_M and VREFN_1 to VREFN_M.

In an embodiment, when the ADC 10 operates in correction mode, the first comparison voltage CV1 may be a voltage corresponding to the common mode voltage VCM.

When the ADC 10 operates in normal mode, the first comparison voltage CV1 may be a voltage corresponding to a sampling value obtained by sampling a portion of the input signal AIN. The first conversion circuit 112 may include a first conversion capacitor array 112_1 and a first conversion switch array 112_2. The first conversion capacitor array 112_1 may include a plurality of capacitors. In an embodiment, the first conversion capacitor array 112_1 may include L capacitors (L is an integer of 2 or more, for all cases discussed hereafter). L may have a different value than N, e.g., L may be an integer greater than N (which is applicable for the other conversion capacitor arrays discussed below).

The first conversion switch array 112_2 may include a plurality of switches. The first conversion circuit 112 may control the operation of the switches included in the first conversion switch array 112_2 based on the control signal CTRL of the control circuit 300, and may select reference voltages supplied to the first conversion capacitor array 112_1. By applying the selected reference voltages to the first conversion capacitor array 112_1, the first conversion circuit 112 may generate the first comparison voltage CV1.

Referring to FIG. 2B, the second DAC 120 according to an embodiment may receive the plurality of reference voltages VREFs from the voltage divider 400. The plurality of reference voltages VREFs may include the first to $M^{th}$ positive reference voltages VREFP_1 to VREFP_M, and the first to $M^{th}$ negative reference voltages VREFN_1 to VREFN_M. The voltage generator 500 may provide the common mode voltage VCM to the second DAC 120.

The second DAC 120 may include a second correction circuit 121 and a second conversion circuit 122. The second correction circuit 121 may generate the second correction voltage VOS2. The second correction circuit 121 may correct the offset of the voltage comparison unit 200 through the second correction voltage VOS2. The second correction circuit 121 may add the second correction voltage VOS2 to the second comparison voltage CV2. That is, the second correction circuit 121 may adjust the second comparison voltage CV2 through the second correction voltage VOS2.

The second correction circuit 121 may include a second correction capacitor array 121_1 and a second correction switch array 121_2. The second correction capacitor array 121_1 may include a plurality of capacitors. The second correction capacitor array 121_1 may include N capacitors. In this case, the correction voltage generated by the second correction circuit 121 may correspond to an N-bit digital value.

The second correction switch array 121_2 may include a plurality of switches. The second correction circuit 121 may control the operation of the switches included in the second correction switch array 121_2 based on the control signal CTRL of the control circuit 300, and may select reference voltages supplied to the second correction capacitor array 121_1. By applying the selected reference voltages to the second correction capacitor array 121_1, the second correction circuit 121 may generate the second correction voltage VOS2.

The second conversion circuit 122 may generate the second comparison voltage CV2 based on the common mode voltage VCM and the plurality of reference voltages VREFP_1 to VREFP_M and VREFN_1 to VREFN_M. The second conversion circuit 122 may include a second conversion capacitor array 122_1 and a second conversion switch array 122_2. The second conversion capacitor array 122_1 may include a plurality of capacitors. The second conversion capacitor array 122_1 may include L capacitors.

The second conversion switch array 122_2 may include a plurality of switches. The second conversion circuit 122 may control the operation of the switches included in the second conversion switch array 122_2 based on the control signal CTRL of the control circuit 300, and may select reference voltages supplied to the second conversion capacitor array 122_1. By applying the selected reference voltages to the second conversion capacitor array 122_1, the second conversion circuit 122 may generate the second comparison voltage CV2.

Referring to FIG. 2C, the third DAC 130 according to an embodiment may receive the plurality of reference voltages VREFs from the voltage divider 400. The plurality of reference voltages VREFs may include the first to $M^{th}$ positive reference voltages VREFP_1 to VREFP_M, and the first to $M^{th}$ negative reference voltages VREFN_1 to VREFN_M. The voltage generator 500 may provide the common mode voltage VCM to the third DAC 130.

The third DAC 130 may include a third correction circuit 131 and a third conversion circuit 132. The third correction circuit 131 may generate the third correction voltage VOS3. The third correction circuit 131 may correct the offset of the voltage comparison unit 200 through the third correction voltage VOS3. The third correction circuit 131 may add the third correction voltage VOS3 to the third comparison voltage CV3. Thus, the third correction circuit 131 may adjust the third comparison voltage CV3 through the third correction voltage VOS3.

The third correction circuit 131 may include a third correction capacitor array 131_1 and a third correction switch array 131_2. The third correction capacitor array 131_1 may include a plurality of capacitors. The third correction capacitor array 131_1 may include N capacitors. The correction voltage generated by the third correction circuit 131 may correspond to an N-bit digital value.

The third correction switch array 131_2 may include a plurality of switches. The third correction circuit 131 may control the operation of the switches included in the third correction switch array 131_2 based on the control signal CTRL of the control circuit 300, and may select reference voltages supplied to the third correction capacitor array 131_1. By applying the selected reference voltages to the third correction capacitor array 131_1, the third correction circuit 131 may generate the third correction voltage VOS3.

The third conversion circuit 132 may generate the third comparison voltage CV3 based on the common mode voltage VCM and the plurality of reference voltages VREFP_1 to VREFP_M and VREFN_1 to VREFN_M. The third conversion circuit 132 may include a third conversion capacitor array 132_1 and a third conversion switch array 132_2. The third conversion capacitor array 132_1 may include a plurality of capacitors. The third conversion capacitor array 132_1 may include L capacitors.

The third conversion switch array 132_2 may include a plurality of switches. The third conversion circuit 132 may control the operation of the switches included in the third conversion switch array 132_2 based on the control signal CTRL of the control circuit 300, and may select reference voltages supplied to the third conversion capacitor array 132_1. By applying the selected reference voltages to the third conversion capacitor array 132_1, the third conversion circuit 132 may generate the third comparison voltage CV3.

Figure 3A:
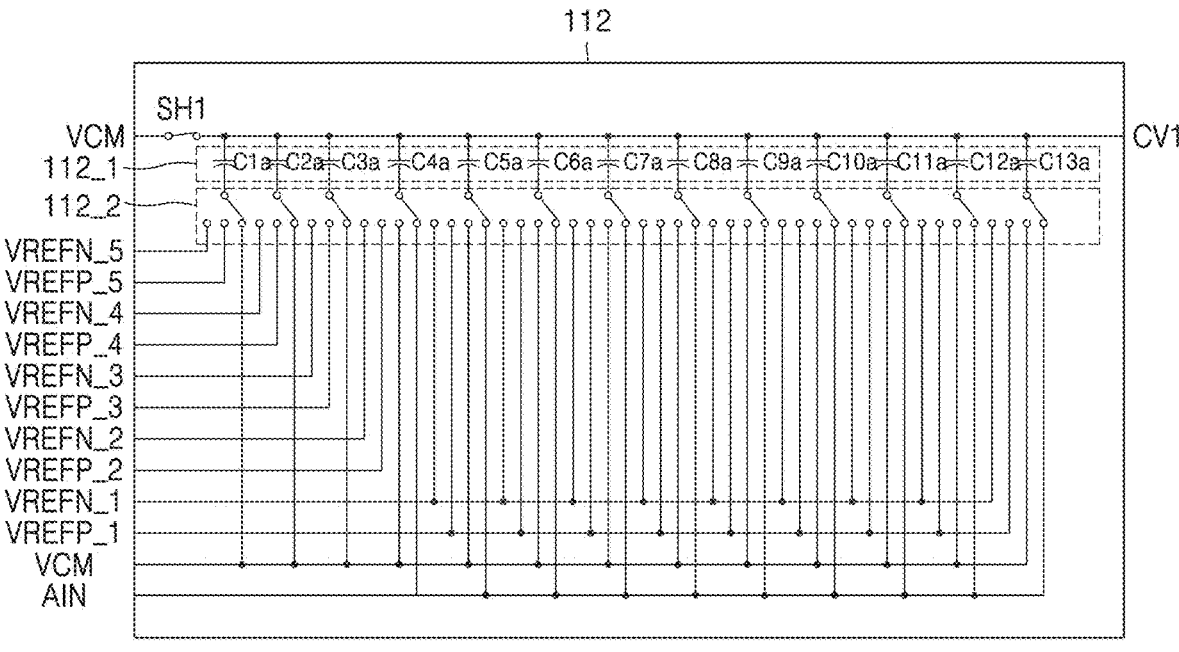
FIGS. 3A and 3B are diagrams of conversion circuits according to an embodiment.
Figure 3B:
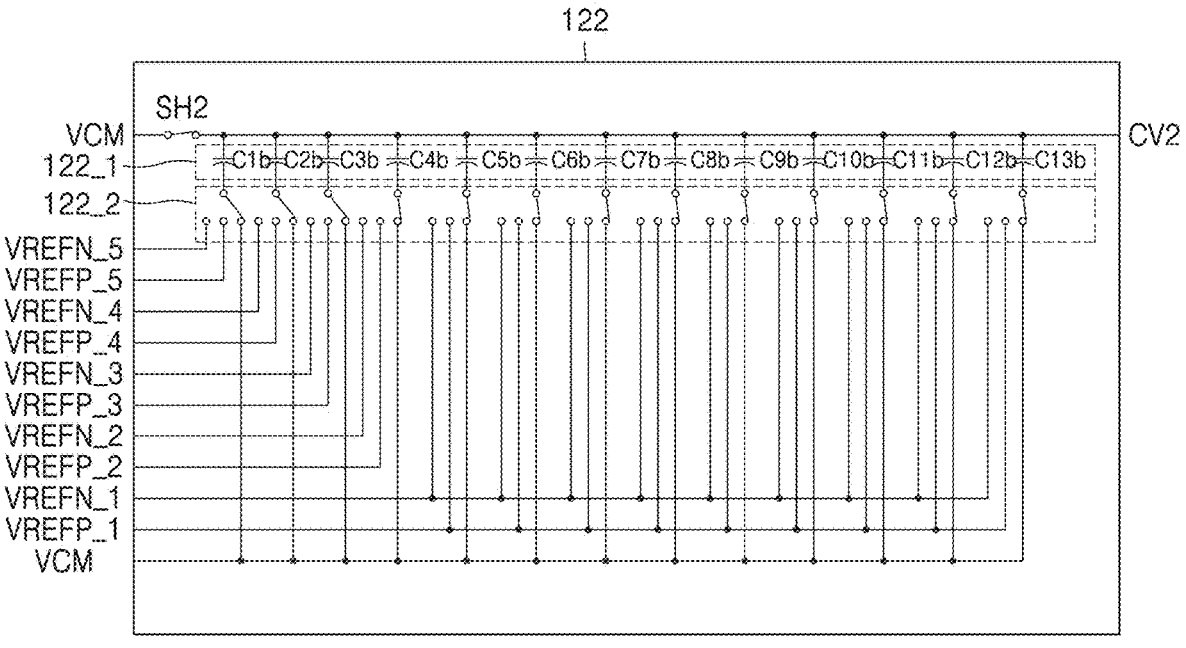

FIGS. 3A and 3B are diagrams of conversion circuits according to an embodiment. Specifically, FIG. 3A is a diagram of the first conversion circuit 112, and FIG. 3B is a diagram of the second conversion circuit 122 and the third conversion circuit 132. FIGS. 3A and 3B may be described with reference to FIGS. 1 to 2C, and redundant descriptions may be omitted.

Referring to FIG. 3A, the first conversion circuit 112 may include the first conversion capacitor array 112_1 and the first conversion switch array 112_2. The first conversion capacitor array 112_1 may include L capacitors. The capacitors herein included in the conversion capacitor arrays 112_1, 122_1, and 132_1 may each be referred to as a conversion capacitor. In the example of FIG. 3A, the first conversion capacitor array 112_1 includes first to thirteenth conversion capacitors C1a to C13a. In other examples, the first conversion capacitor array 112_1 includes more or fewer conversion capacitors.

The first to thirteenth conversion capacitors C1a to C13a may each be composed of at least one unit capacitor. The capacitance of one unit capacitor may be referred to as 1. Cu herein. For example, the capacitance of the first to fifth conversion capacitors C1a to C5a may be 1 Cu. The capacitance of the sixth conversion capacitor C6a may be 2 Cu. The capacitance of the seventh conversion capacitor C7a may be 4 Cu. The capacitance of the eighth conversion capacitor C8a may be 5 Cu. The capacitance of the ninth conversion capacitor C9a may be 10 Cu. The capacitance of the tenth conversion capacitor C10a may be 11 Cu. The capacitance of the eleventh conversion capacitor C11a may be 22 Cu. The capacitance of the twelfth conversion capacitor C12a may be 24 Cu. The capacitance of the thirteenth conversion capacitor C13a may be 48 Cu. The capacitance of each conversion capacitor shown in FIG. 3A is illustrative and may be configured to have a different value in other examples.

The first conversion switch array 112_2 may be configured to select, based on the control signal CTRL of the control circuit 300, reference voltages respectively applied to the conversion capacitors included in the first conversion capacitor array 112_1.

The first conversion circuit 112 may generate the first comparison voltage CV1 by sequentially switching switches connected to the first to thirteenth conversion capacitors C1a to C13a based on the control signal CTRL.

Switching of the switches connected to the conversion capacitors, respectively, may be performed in the order from the thirteenth conversion capacitor C13a to the first conversion capacitor C1a, and two switches may be operated at once. For example, assuming that the digital-to-analog conversion unit 100 performs a conversion operation during a total of 7 conversion cycles when the ADC 10 generates the output signal DOUT, the operation of the digital-to-analog conversion unit 100 may be divided into a sampling phase, an inversion phase, and first to seventh conversion phases.

In the sampling phase, the first conversion circuit 112 may close a switch SH1 and sample the input signal AIN. In the sampling phase, the first comparison voltage CV1 may be equal to the common mode voltage VCM. The first comparison voltage CV1 may be referred to as a sampling voltage.

In the inversion phase, the first conversion circuit 112 may open the switch SH1, and may be placed in a floating state. The first comparison voltage CV1 may be referred to as an inversion voltage.

In the first conversion phase, the first conversion circuit 112 may switch switches connected to the thirteenth conversion capacitor C13a and the twelfth conversion capacitor C12a. The first comparison voltage CV1 may be referred to as a first phase voltage.

In the second to sixth conversion phases, the switching operation of the first conversion circuit 112 may be performed similarly to that in the first conversion phase. The first comparison voltage CV1 that changes for each phase due to switching may be referred to as second to sixth phase voltages.

In the seventh conversion phase, the first conversion circuit 112 may perform an operation of switching each switch of the first conversion switch array 112_2 to the original position. The first comparison voltage CV1 may be equal to the common mode voltage VCM, and the first comparison voltage CV1 may be referred to as a seventh phase voltage.

Referring to FIG. 3B, the second conversion circuit 122 may include the second conversion capacitor array 122_1 and the second conversion switch array 122_2. The second conversion capacitor array 122_1 may include first to thirteenth conversion capacitors C1b to C13b. The second conversion circuit 122 may have a similar structure to the first conversion circuit 112, and redundant descriptions are omitted.

The second conversion switch array 122_2 may be configured to select, based on the control signal CTRL of the control circuit 300, reference voltages respectively applied to the conversion capacitors included in the second conversion capacitor array 122_1.

The reference voltages respectively applied to the conversion capacitors of the second conversion capacitor array 122_1 may each be a voltage having a value less than 0. Thus, the reference voltages applied respectively to the conversion capacitors of the second conversion capacitor array 122_1 may be negative reference voltages (e.g., the reference voltages VREFN_1, VREFN_2, . . . , VREFN_5).

The second conversion circuit 122 may generate the second comparison voltage CV2 by selectively switching switches connected to the first to thirteenth conversion capacitors C1b to C13b based on the control signal CTRL. Switching of the switches connected to the conversion capacitors, respectively, may be performed in the order from the thirteenth conversion capacitor C13b to the first conversion capacitor C1*b*. The switching of switches of the second conversion switch array 122_2 by the second conversion circuit 122 may be determined based on the operation cycle of the digital-to-analog conversion unit 100. For example, in the first conversion phase, the switch connected to the thirteenth conversion capacitor C13*b* may be switched, and in the second conversion phase, the switch connected to the eleventh conversion capacitor C11*b* may be switched.

The third conversion circuit 132 may have a similar structure to the first conversion circuit 112 and the second conversion circuit 122. The third conversion circuit 132 may operate similarly to the second conversion circuit 122.

In another example, the reference voltages respectively applied to the conversion capacitors of the third conversion capacitor array 132_1 may be voltages having a value greater than 0. Thus, the reference voltages respectively applied to the conversion capacitors of the third conversion capacitor array 132_1 may be positive reference voltages (e.g., reference voltages VREFP_1, VREFP_2, . . . , VREFP_5).

Figure 4B:
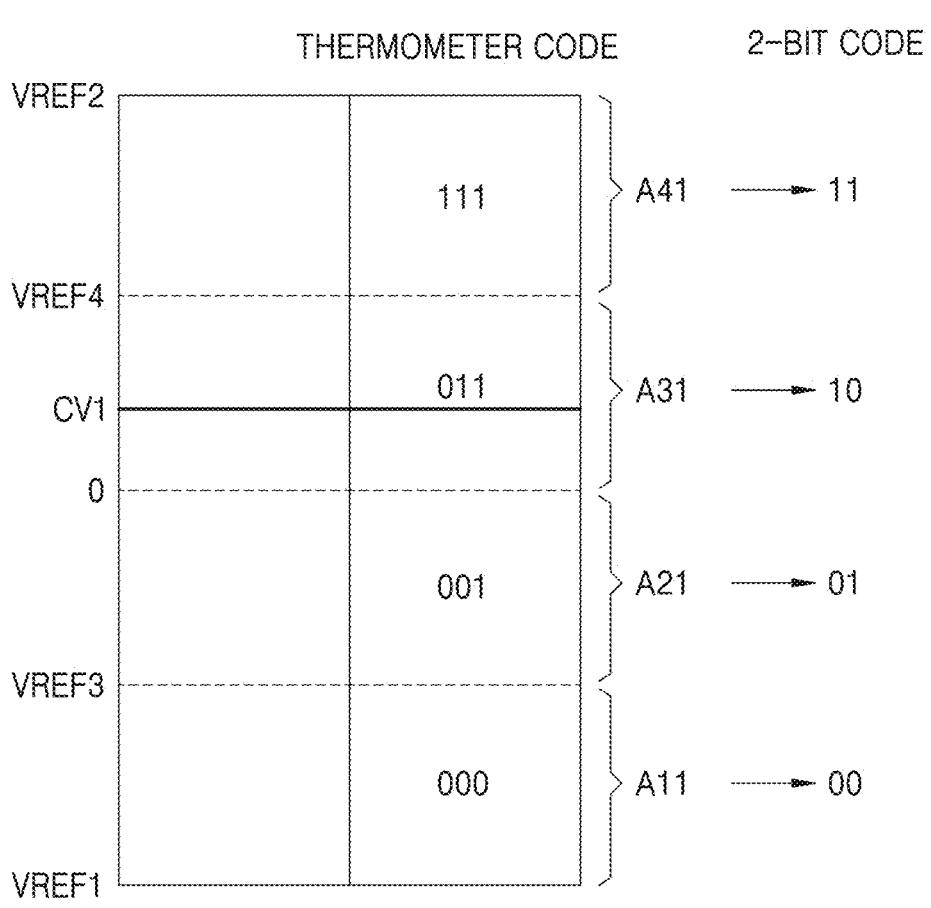
Figure 4C:
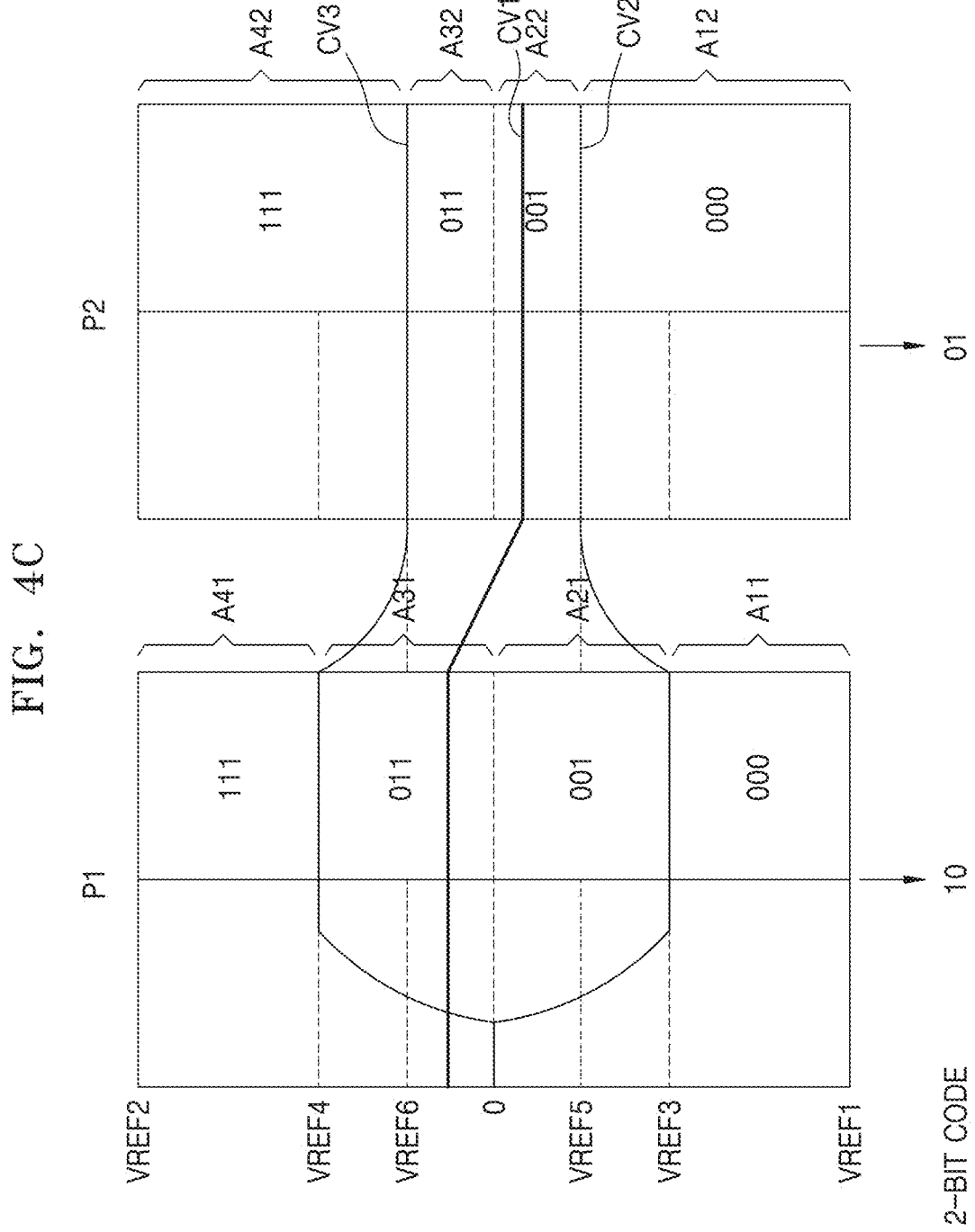

FIGS. 4A to 4C are diagrams illustrating the operation of the ADC 10 according to an embodiment. For example, FIGS. 4A and 4B are diagrams illustrating conversion of the thermometer code generated based on the first comparison result signal CRS1, the second comparison result signal CRS2, and the third comparison result signal CRS3 into a 2-bit code. FIG. 4C is a diagram illustrating a method of determining a 2-bit code according to the magnitude of the first conversion voltage CV1 in the first conversion phase P1 and the second conversion phase P2.

Referring to FIG. 4A, the first to third comparison result signals CRS1, CRS2, and CRS3 may be generated whenever the magnitude of the first comparison voltage CV1 changes by at least a threshold amount.

In the sampling phase to the seventh conversion phase, the values of the first to third comparison result signals CRS1, CRS2, and CRS3 corresponding to each phase may be expressed as a 3-bit thermometer code. The value of the third comparison result signal CRS3 may be the most significant bit of the thermometer code, and the value of the first comparison result signal CRS1 may be the least significant bit of the thermometer code. The latch encoder 320 may convert the thermometer code into a 2-bit code.

Referring to FIG. 4B, when the first comparison voltage CV1 is included in region A11 in a specific phase, the thermometer code may be "000". The latch encoder 320 may encode the 3-bit thermometer code into a 2-bit value of "00". When the first comparison voltage CV1 is included in region A21, the thermometer code may be "001". The latch encoder 320 may encode the 3-bit thermometer code into a 2-bit value of "01". When the first comparison voltage CV1 is included in region A31, the thermometer code may be "011". The latch encoder 320 may encode the 3-bit thermometer code into a 2-bit value of "10". When the first comparison voltage CV1 is included in region A41, the thermometer code may be "111". The latch encoder 320 may encode the 3-bit thermometer code into a 2-bit value of "11".

The first comparison voltage CV1 may be adjusted within the range of the first comparison reference voltage VREF1 to the second comparison reference voltage VREF2. In an embodiment, the first comparison reference voltage VREF1 may be a positive supply voltage supplied by the voltage generator 500, and the second comparison reference voltage VREF2 may be a negative supply voltage supplied by the voltage generator 500.

Referring to FIG. 4C, a digital value corresponding to the first comparison voltage CV1 may be determined depending on a voltage region to which the first comparison voltage CV1 belongs. For convenience of explanation, the first conversion phase P1 and the second conversion phase P2 are illustrated.

The control circuit 300 may increase or decrease a value of the first comparison voltage CV1 by switching switches of the first conversion switch array 112_2 based on the thermometer code value. The control circuit 300 may determine the second comparison voltage CV2 by switching the switches of the second conversion switch array 122_2 according to the operation phase of the digital-to-analog conversion unit 100. The control circuit 300 may determine the third comparison voltage CV3 by switching switches of the third conversion switch array 132_2 according to the operation phase of the digital-to-analog conversion unit 100.

In the first conversion phase P1, the control circuit 300 may determine that the second comparison voltage CV2 becomes a third comparison reference voltage VREF3, and may determine that the third comparison voltage CV3 becomes a fourth comparison reference voltage VREF4. In the first conversion phase P1, the value of the first comparison voltage CV1 may be included in region A31. The value of the thermometer code may be "011", and may be converted into "10" by the latch encoder 320. The control circuit 300 may decrease the value of the first comparison voltage CV1 based on the thermometer code value.

In the second conversion phase P2, the control circuit 300 may determine that the second comparison voltage CV2 becomes a fifth comparison reference voltage VREF5, and may determine that the comparison voltage CV3 becomes a sixth comparison reference voltage VREF6. In the second conversion phase P2, the value of the first comparison voltage CV1 may be included in region A22. The value of the thermometer code may be "001", and may be converted into "01" by the latch encoder 320. The control circuit 300 may increase the value of the first comparison voltage CV1 based on the thermometer code value.

Figure 5:
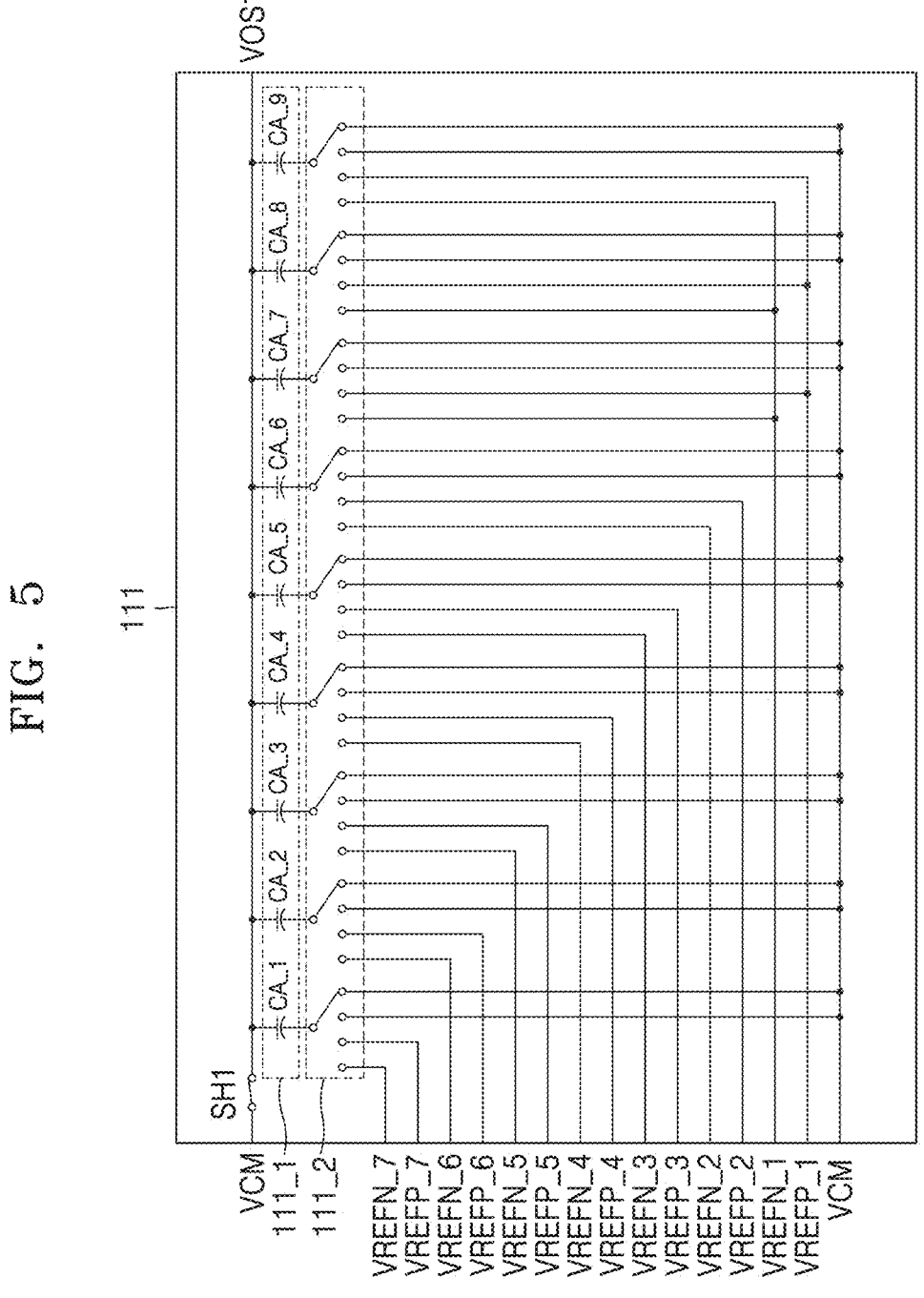
FIG. 5 is a diagram of a correction circuit according to an embodiment.

FIG. 5 is a diagram of a correction circuit according to an embodiment. FIG. 5 may be described with reference to FIGS. 1 to 3B, and redundant descriptions may be omitted.

When the ADC 10 operates in correction mode, the correction circuits 111, 121, and 131 may generate the correction voltages VOS1, VOS2, and VOS3. When the ADC 10 operates in correction mode, the common mode voltage VCM may be applied as the input signal AIN. When the input signal AIN is the common mode voltage VCM and the value of the output signal DOUT does not match a target value (within a tolerance range), it may be desirable or necessary to correct an offset. For example, assuming that the ideal value of the output signal DOUT corresponding to the common mode voltage VCM is a first output value, size mismatch may occur between transistors included in the voltage comparison unit 200 during the semiconductor process, and this size mismatch may cause errors in the output of each comparison circuit 210, 220, and 230. Due to the errors, the value of the output signal DOUT may have a second output value different from the first output value. Here, the difference between the second output value and the first output value may be caused by the offset of the voltage comparison unit 200. In other words, the accuracy in converting analog signals to digital signals may be reduced due to the offset. The offset may be corrected by adjusting the magnitude of voltages respectively applied to the first comparison circuit 210, the second comparison circuit 220, and the third comparison circuit 230. Thus, the voltages applied respectively to the first comparison circuit 210, the second comparison circuit 220, and the third comparison circuit 230 may be adjusted by the correction voltages VOS1, VOS2, and VOS3 generated from the correction circuits 111, 121, and 131.

Referring to FIG. 5, the first correction circuit 111 may include the first correction capacitor array 111_1 and the first correction switch array 111_2. The first correction circuit 111 may generate the first correction voltage VOS1.

The first correction capacitor array 111_1 may include N capacitors (N is an integer of 2 or more). The capacitors included in the correction capacitor arrays 111_1, 121_1, and 131_1 may each be referred to as correction capacitors herein. In an embodiment, the first correction capacitor array 111_1 may include first to ninth correction capacitors CA_1 to CA_9. In FIG. 5, the first correction capacitor array 111_1 is illustrated as including 9 correction capacitors, but may include fewer or more correction capacitors.

The first to ninth correction capacitors CA_1 to CA_9 may each be composed of at least one unit capacitor. For example, the capacitance of the first to seventh correction capacitors CA_1 to CA_7 may be 1 Cu. The capacitance of the eighth correction capacitor CA_8 may be 2 Cu. The capacitance of the ninth correction capacitor CA_9 may be 4 Cu. The capacitance of each capacitor shown in FIG. 5 is illustrative and may be configured to have a different value.

Hereinafter, it is assumed that the ADC 10 operates in correction mode and corrects an offset of the first comparison circuit 210. Therefore, it is assumed that the common mode voltage VCM is applied as the first comparison voltage CV1, and is similarly applied as the second comparison voltage CV2.

Due to the offset of the first comparison circuit 210, the first comparison result signal CRS1, which is the output of the first comparison circuit 210, may be "1" or "0" even though the first comparison voltage CV1 and the second comparison voltage CV2 having the same magnitude are applied to the input of the first comparison circuit 210. Thus, without the offset correction described herein, errors in the final digital result may occur due to the offsets.

The control circuit 300 may generate the control signal CTRL including a control bit based on the first comparison result signal CRS1. For example, when the number of correction capacitors included in the first correction capacitor array 111_1 is N, N control bits may be generated. The ADC 10 may generate a first correction voltage signal when the correction mode operation is completed. The first correction voltage VOS1 may correspond to the first correction voltage signal consisting of N bits. The first correction voltage signal may include N control bits.

The first correction circuit 111 may generate a correction voltage by switching switches connected to the first to ninth correction capacitors CA_1 to CA_9. In an embodiment, the switches included in the first correction switch array 111_2 may be switched sequentially from the switch connected to the ninth correction capacitor CA_9 to the switch connected to the first correction capacitor CA_1. In other words, the first correction circuit 111 may perform switching in the order from a switch (e.g., ninth correction capacitor CA_9) connected to a correction capacitor with the largest capacitance to a switch (e.g., first correction capacitor CA_1) connected to a correction capacitor with the smallest capacitance.

The first correction circuit 111 may generate the first correction voltage VOS1 by switching the switch connected to the ninth correction capacitor CA_9. In an embodiment, when the value of the first comparison result signal CRS1 is "1", the first correction circuit 111 may switch a switch connected to a correction capacitor so that a negative reference voltage is applied. For example, the first correction circuit 111 may switch the switch connected to the ninth correction capacitor CA_9 so that the first negative reference voltage VREFN_1 is applied. In an embodiment, when the value of the first comparison result signal CRS1 is "0", the first correction circuit 111 may switch a switch connected to a correction capacitor so that a positive reference voltage is applied. For example, the first correction circuit 111 may switch the switch connected to the ninth correction capacitor CA_9 so that the first positive reference voltage VREFP_1 is applied.

By adding the first correction voltage VOS1 to the first comparison voltage CV1, the first comparison voltage CV1 may be adjusted. The first comparison circuit 210 may perform an operation of comparing the adjusted first comparison voltage CV1 with the second comparison voltage CV2. The first comparison result signal CRS1 may be generated based on a result of comparing the adjusted first comparison voltage CV1 with the second comparison voltage CV2. The generated first comparison result signal CRS1 may be referred to as a second control bit.

The first correction circuit 111 may increase or decrease the first correction voltage VOS1 by switching the switch connected to the eighth correction capacitor CA_8.

In an embodiment, when the value of the first comparison result signal CRS1 is "1", the correction circuit 111 may decrease the first correction voltage VOS1 by switching the switch connected to the eighth correction capacitor CA_8 so that the first negative reference voltage VREFN_1 is applied. In an embodiment, when the value of the first comparison result signal CRS1 is "0", the first correction circuit 111 may increase the first correction voltage VOS1 by switching the switch connected to the eighth correction capacitor CA_8 so that the first positive reference voltage VREFP_1 is applied.

The seventh correction capacitor CA_7 to the first correction capacitor CA_1 may operate similarly to the eighth correction capacitor CA_8. By switching the switch connected to the first correction capacitor CA_1, which is the last correction capacitor, the correction operation of the ADC 10 may be completed.

The generation of the first correction voltage VOS1 by switching the switches connected to the ninth correction capacitor CA_9 to the first correction capacitor CA_1 may be expressed as Equation 1 below.

$$VOS1 = \sum_{j=1}^{N}\left\{\frac{CA\_j}{CTotal} \times (VP\_j \times DA\_j + VN\_j \times \overline{DA\_j})\right\} \qquad \text{Equation 1}$$

In Equation 1, N may refer to the number of correction capacitors included in the first correction capacitor array 111_1. CA_j may refer to the capacitance of the $j^{th}$ correction capacitor. CTotal may refer to the total capacitance of N correction capacitors. VP_j may refer to a positive reference voltage applied to the $j^{th}$ correction capacitor. DA_j may refer to a control bit (e.g., $j^{th}$ control bit) corresponding to the $j^{th}$ correction capacitor. VN_j may refer to a negative reference voltage applied to the $j^{th}$ correction capacitor.

The output signal DOUT of the ADC 10 may be a digital signal of k bits (k is an integer of 2 or more). The least significant bit of the output signal DOUT may be referred to as LSB. In other words, LSB may refer to a minimum division unit for converting the input signal AIN into a digital signal. For example, in a k-bit differential ADC, 1 LSB may be expressed as Equation 2 below.

$$1LSB = \frac{2 \times (VREFP - VREFN)}{2^k}[V] \qquad \text{Equation 2}$$

In Equation 2, VREFP may refer to a largest positive reference voltage among the positive reference voltages provided by the voltage divider 400. For example, it may be +1 V. VREFN may refer to a smallest (in magnitude) negative reference voltage among the negative reference voltages provided by the voltage divider 400. For example, it may be −1 V.

The correction circuits 111, 121, and 131 according to an embodiment may generate a correction voltage with a minimum division unit more precise than 1 LSB (e.g., 0.125 LSB). To this end, a second conversion capacitor C2a of FIG. 3A may be a capacitor that determines the LSB of the output signal DOUT. A fourth positive reference voltage VREFP_4 or a fourth negative reference voltage VREFN_4 may be applied to the second conversion capacitor C2a of FIG. 3A. The fourth positive reference voltage VREFP_4 or the fourth negative reference voltage VREFN_4 may also be applied to a fourth correction capacitor CA_4 of FIG. 5. Therefore, the first correction circuit 111 may adjust the first correction voltage VOS1 to a positive or negative reference voltage divided in units of 1 LSB by switching the switch connected to the fourth correction capacitor CA_4. As described above in FIG. 1, the first to M$^{th}$ positive reference voltages may be configured to sequentially decrease by an exponential number of 2. The first to M$^{th}$ negative reference voltages may be configured to sequentially decrease (in magnitude) by an exponential number of 2. Therefore, the first correction circuit 111 may adjust the first correction voltage VOS1 to a positive or negative reference voltage divided in units of 0.5 LSB by switching the switch connected to the third correction capacitor CA_3. Similarly, the first correction circuit 111 may adjust the first correction voltage VOS1 to a positive or negative reference voltage divided in units of 0.25 LSB by switching the switch connected to the second correction capacitor CA_2. In addition, the first correction circuit 111 may adjust the first correction voltage VOS1 to a positive or negative reference voltage divided in units of 0.125 LSB by switching the switch connected to the first correction capacitor CA_1.

The second correction circuit 121 and the third correction circuit 131 may have a similar configuration to the first correction circuit 111, and may operate in the same manner as the first correction circuit 111.

Figure 6:
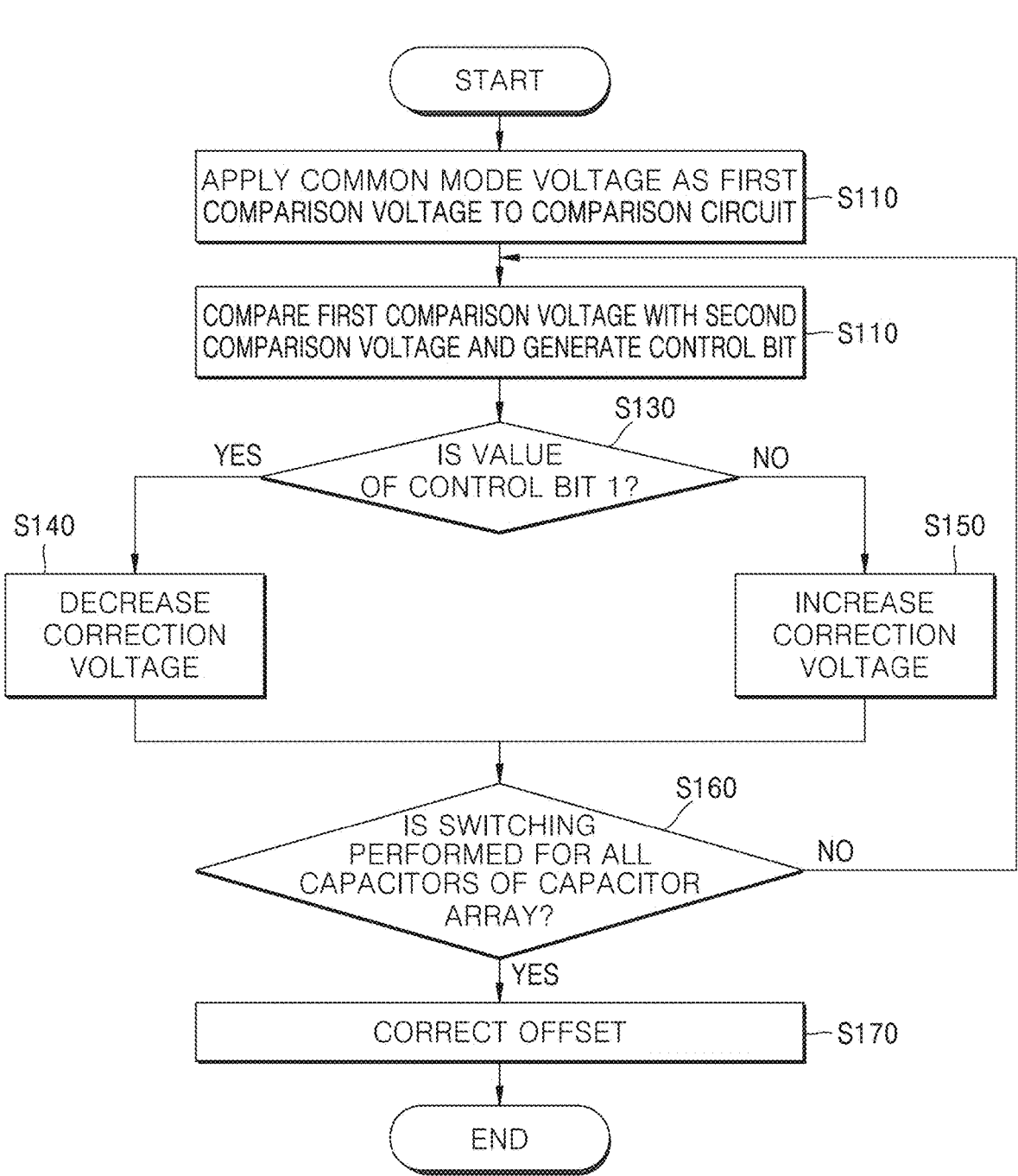
FIG. 6 is a flowchart of an offset correction method according to an embodiment.

FIG. 6 is a flowchart of an offset correction method according to an embodiment. FIG. 6 illustrates the first DAC 110, but the second DAC 120 and the third DAC 130 may also operate in the same manner. FIG. 6 may be described with reference to FIGS. 1, 3A, 3B, and 5, and redundant descriptions may be omitted.

Referring to FIG. 6, in operation S110, the ADC 10 may set the first DAC 110 to operate in correction mode. The ADC 10 may apply the common mode voltage VCM as the first comparison voltage CV1 to the first comparison circuit 210. In an embodiment, the first comparison voltage CV1 may be applied to a first terminal of the first comparison circuit 210.

In operation S120, the ADC 10 may compare the first comparison voltage CV1 with the second comparison voltage CV2. The ADC 10 may generate a control bit based on a result of comparing the first comparison voltage CV1 with the second comparison voltage CV2.

In operation S130, the ADC 10 may determine reference voltages to be applied to the first correction circuit 111, from among the plurality of reference voltages VREFs based on the value of the control bit generated in operation S120.

The ADC 10 may determine that a negative reference voltage is applied to a correction circuit when the value of the control bit is "1".

The ADC 10 may determine that a positive reference voltage is applied to a correction circuit when the value of the control bit is "0".

In operation S140, when the value of the control bit in operation S130 is "1", the ADC 10 may perform an operation of decreasing a correction voltage. By switching switches to apply the reference voltage to the first correction capacitor array 111_1, the ADC 10 may decrease the first correction voltage VOS1, and may adjust the first comparison voltage CV1. The first comparison voltage CV1 may be decreased by the first correction voltage VOS1.

When the first comparison voltage CV1 is greater than the second comparison voltage CV2, the ADC 10 may generate a correction voltage by switching switches to apply the first reference voltage to a first capacitor of the first correction circuit 111. For example, the first reference voltage may be a negative reference voltage corresponding to the first capacitor.

When the adjusted first comparison voltage CV1 is greater than the second comparison voltage CV2, the ADC 10 may decrease a correction voltage by switching switches to apply the third reference voltage to a second capacitor thereof. For example, the third reference voltage may be a negative reference voltage corresponding to the second capacitor.

The ADC 10 may sequentially switch switches connected to the third to ninth capacitors, and may perform switching in the same way as switching the switch connected to the second capacitor.

The first capacitor may be a capacitor with the largest capacitance among the correction capacitors included in the first correction capacitor array 111_1. For example, the first capacitor may be the ninth correction capacitor CA_9, and the negative reference voltage corresponding to the first capacitor may be the first negative reference voltage VREFN_1.

The ninth capacitor may be a capacitor with the smallest capacitance among the correction capacitors included in the first correction capacitor array 111_1, and may be a capacitor to which the smallest negative reference voltage is applied. For example, the ninth capacitor may be the first correction capacitor CA_1, and the negative reference voltage corresponding to the ninth capacitor may be the seventh negative reference voltage VREFN_7.

In operation S150, when the value of the control bit in operation S130 is "0", the ADC 10 may perform an operation of increasing a correction voltage. By switching the switches to apply the reference voltage to the first correction capacitor array 111_1, the ADC 10 may increase the first correction voltage VOS1, and may adjust the first comparison voltage CV1. The first comparison voltage CV1 may be increased by the first correction voltage VOS1.

When the first comparison voltage CV1 is less than the second comparison voltage CV2, the ADC 10 may generate a correction voltage by switching switches to apply the second reference voltage to the first capacitor of the first correction circuit 111. For example, the second reference voltage may be a positive reference voltage corresponding to the first capacitor.

When the adjusted first comparison voltage CV1 is less than the second comparison voltage CV2, the ADC 10 may increase the correction voltage by switching switches to apply the fourth reference voltage to the second capacitor. For example, the fourth reference voltage may be a positive reference voltage corresponding to the second capacitor.

The ADC 10 may sequentially switch switches connected to the third to ninth capacitors, and may perform switching in the same way as switching the switch connected to the second capacitor.

Similar to operation S140, the first capacitor may be a capacitor with the largest capacitance among the correction capacitors included in the first correction capacitor array 111_1. For example, the first capacitor may be the ninth correction capacitor CA_9, and the positive reference voltage corresponding to the first capacitor may be the first positive reference voltage VREFP_1.

Similar to operation S140, the ninth capacitor may be a capacitor with the smallest capacitance among the correction capacitors included in the first correction capacitor array 111_1, and may be a capacitor to which the smallest positive reference voltage is applied. For example, the ninth capacitor may be the first correction capacitor CA_1, and the positive reference voltage corresponding to the ninth capacitor may be the seventh positive reference voltage VREFP_7.

In operation S160, the ADC 10 may determine whether the switches respectively connected to capacitors are switched for all correction capacitors included in the first correction capacitor array 111_1.

When there are capacitors to which the reference voltage is not applied, the ADC 10 may perform operation S120 again to determine the reference voltage to be applied to the capacitor adjacent to the capacitor to which the reference voltage is applied through switching in operation S140 or operation S150.

In operation S170, when the switches respectively connected to the capacitors are switched for all correction capacitors included in the first correction capacitor array 111_1 in operation S160, the ADC 10 may generate a first correction voltage signal corresponding to the first correction voltage VOS1, and may complete the correction mode.

When operating in normal mode, the ADC 10 may generate the first correction voltage VOS1 corresponding to the first correction voltage signal, and may adjust the first comparison voltage CV1 through the first correction voltage VOS1. By adjusting the first comparison voltage CV1, the offset of the first comparison circuit 210 may be corrected.

Figure 7:
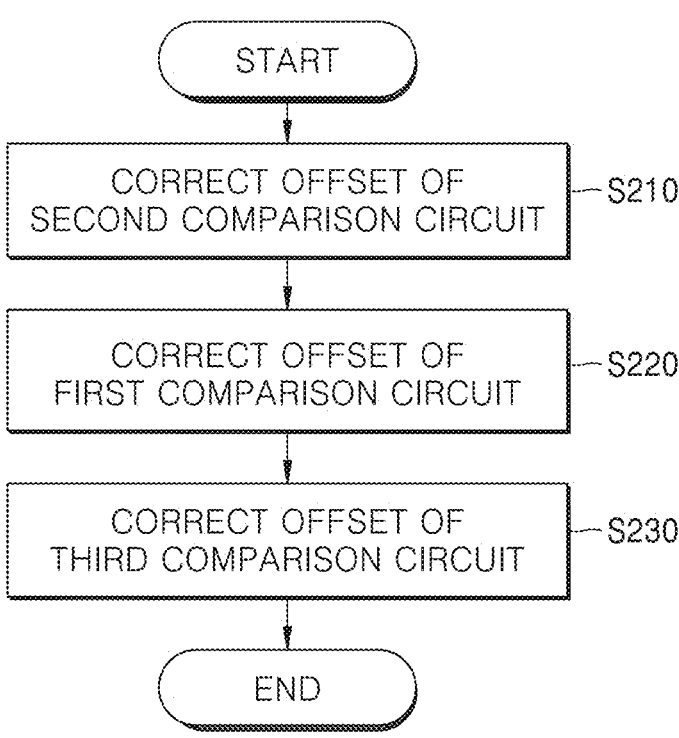
FIG. 7 is a flowchart of an offset correction method according to an embodiment.

FIG. 7 is a flowchart of an offset correction method according to an embodiment. For example, FIG. 7 is a diagram illustrating the sequence of correction operations between the first comparison circuit 210, the second comparison circuit 220, and the third comparison circuit 230. FIG. 7 may be described with reference to FIG. 1, and redundant descriptions may be omitted.

In operation S210, the ADC 10 may correct an offset of the second comparison circuit 220.

The output value of the second comparison circuit 220 may change based on the first comparison voltage CV1. The ADC 10 may adjust the first comparison voltage CV1 through the first correction voltage VOS1. The offset of the second comparison circuit 220 may be corrected through the first correction voltage VOS1.

The offset of comparison circuits may be corrected first on a comparison circuit with one input terminal AC grounded, such as the second comparison circuit 220. Operation S210 is described below with reference to FIG. 8A.

In operation S220, the ADC 10 may correct the offset of the first comparison circuit 210.

The output value of the first comparison circuit 210 may change based on the first comparison voltage CV1 and the second comparison voltage CV2. The ADC 10 may adjust the second comparison voltage CV2 through the second correction voltage VOS2. The offset of the first comparison circuit 210 may be corrected through the first correction voltage VOS1 and the second correction voltage VOS2. Operation S220 is described below with reference to FIG. 8B.

In operation S230, the ADC 10 may correct an offset of the third comparison circuit 230.

The output value of the third comparison circuit 230 may change based on the first comparison voltage CV1 and the third comparison voltage CV3. The ADC 10 may adjust the third comparison voltage CV3 through the third correction voltage VOS3. The offset of the first comparison circuit 210 may be corrected through the first correction voltage VOS1 and the third correction voltage VOS3. Operation S230 is described below with reference to FIG. 8C.

Figure 8A:
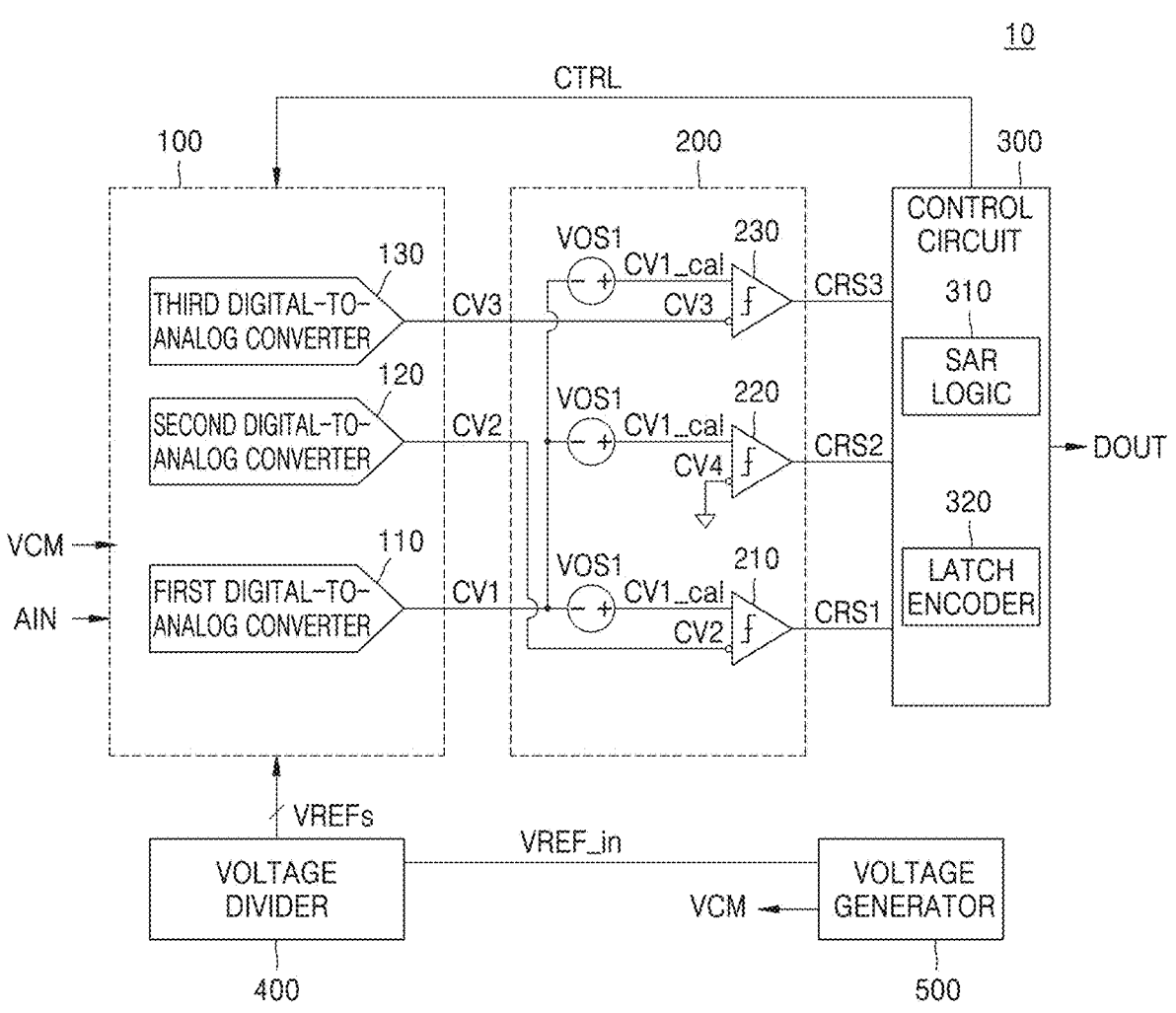
FIGS. 8A, 8B and 8C are diagrams of an analog-to-digital converter according to an embodiment.
Figure 8B:
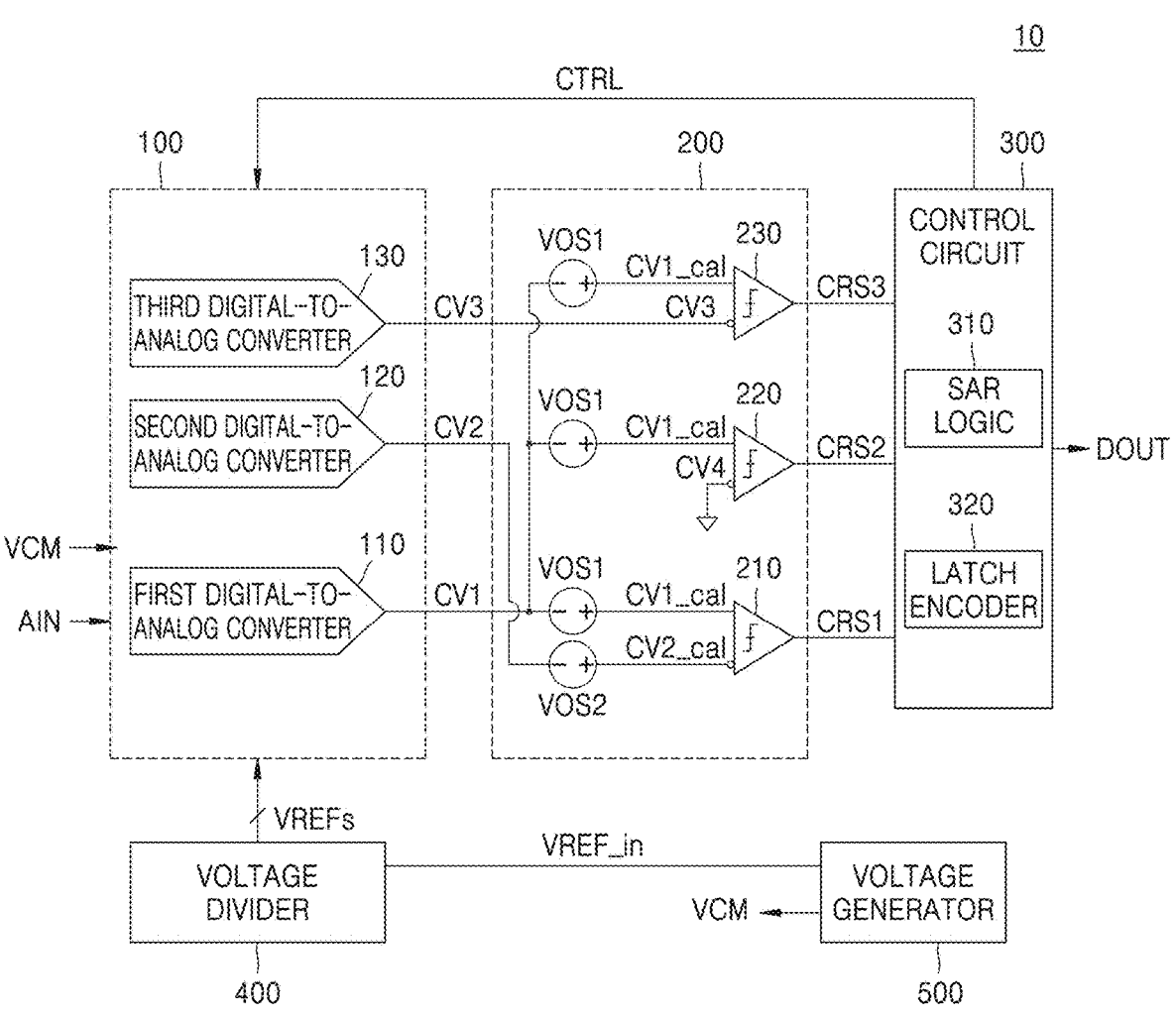
Figure 8C:
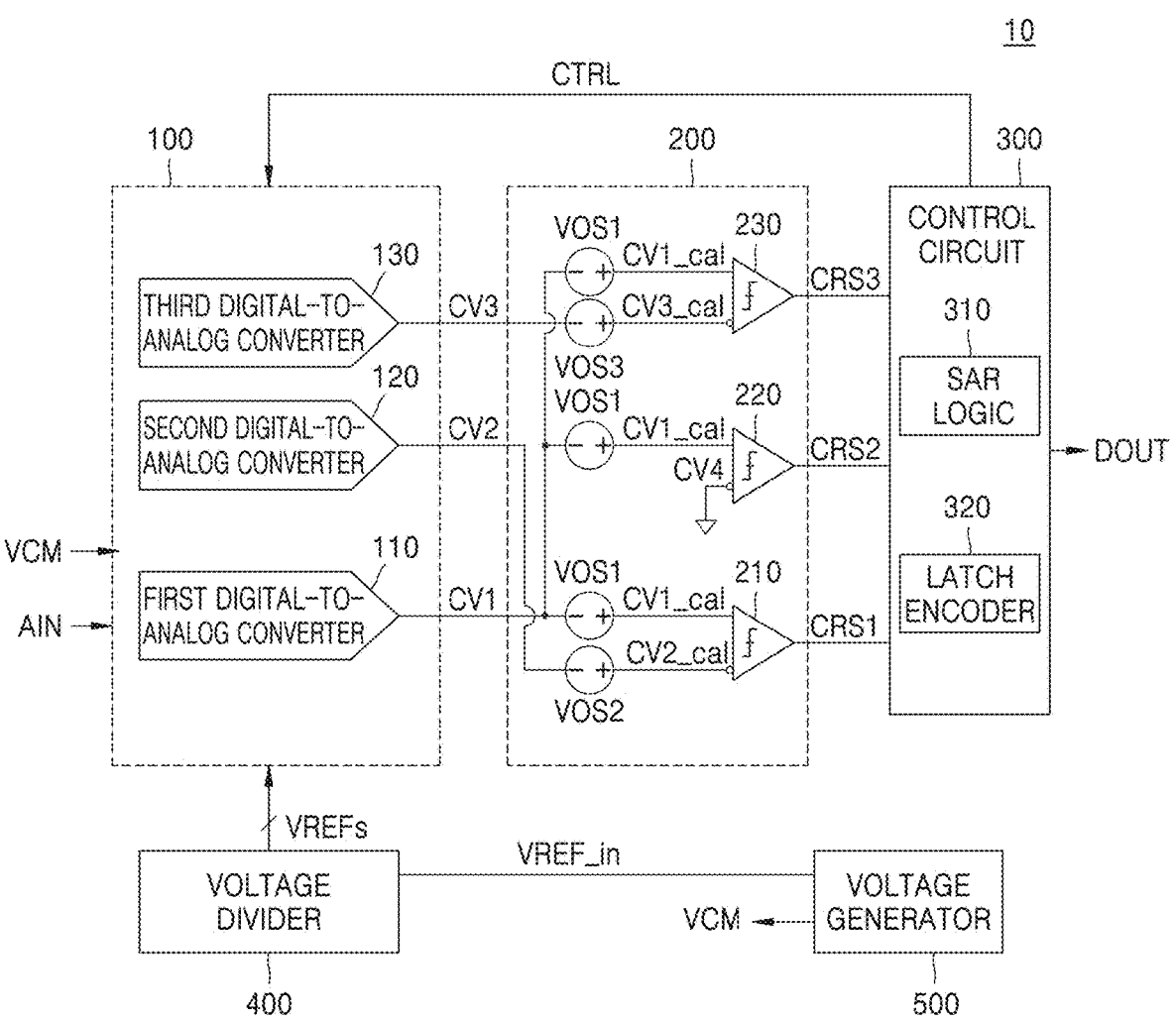

FIGS. 8A to 8C are diagrams of the ADC 10 according to an embodiment. In particular, FIGS. 8A to 8C are diagrams illustrating the offset correction method of FIG. 7. FIGS. 8A to 8C may be described with reference to FIGS. 1 to 7, and redundant descriptions may be omitted.

The ADC 10 may determine the offset correction order of the first comparison circuit 210, the second comparison circuit 220, and the third comparison circuit 330 through the control circuit 300.

Referring to FIG. 8A, the control circuit 300 may determine the generation of the first correction voltage VOS1. The first DAC 110 may operate in correction mode under the control by the control circuit 300, and may generate the first correction voltage VOS1. The first correction voltage VOS1 may be added to the first comparison voltage CV1. The voltage obtained by adding the first correction voltage VOS1 to the first comparison voltage CV1 may be referred to as a first corrected comparison voltage CV1_cal. The first corrected comparison voltage CV1_cal may be applied to the first terminals of each of the first to third comparison circuits 210, 220 and 230. The offset of the second comparison circuit 220 may be corrected through the first corrected comparison voltage CV1_cal.

Referring to FIG. 8B, the control circuit 300 may correct the offset of the first comparison circuit 210. The second DAC 120 may operate in correction mode under the control by the control circuit 300, and may generate the second correction voltage VOS2. The second correction voltage VOS2 may be added to the second comparison voltage CV2. The voltage obtained by adding the second correction voltage VOS2 to the second comparison voltage CV2 may be referred to as a second corrected comparison voltage CV2_cal. The second corrected comparison voltage CV2_cal may be applied to a second terminal of the first comparison circuit 210. The offset of the first comparison circuit 210 may be corrected through the first corrected comparison voltage CV1_cal and the second corrected comparison voltage CV2_cal.

Referring to FIG. 8C, the control circuit 300 may correct the offset of the third comparison circuit 230. The third DAC 130 may operate in correction mode under the control by the control circuit 300, and may generate the third correction voltage VOS3. The third correction voltage VOS3 may be added to the third comparison voltage CV3. The voltage obtained by adding the third correction voltage VOS3 to the third comparison voltage CV3 may be referred to as a third corrected comparison voltage CV3_cal. The third corrected comparison voltage CV3_cal may be applied to a second terminal of the third comparison circuit 230. The offset of the third comparison circuit 230 may be corrected through the first corrected comparison voltage CV1_cal and the third corrected comparison voltage CV3_cal.

By correcting the offsets of the first comparison circuit 210, the second comparison circuit 220, and the third comparison circuit 230, the errors of the output signal DOUT of the ADC 10 may be reduced. Accordingly, consistency between the input signal AIN and the output signal DOUT may be improved.

Figure 9:
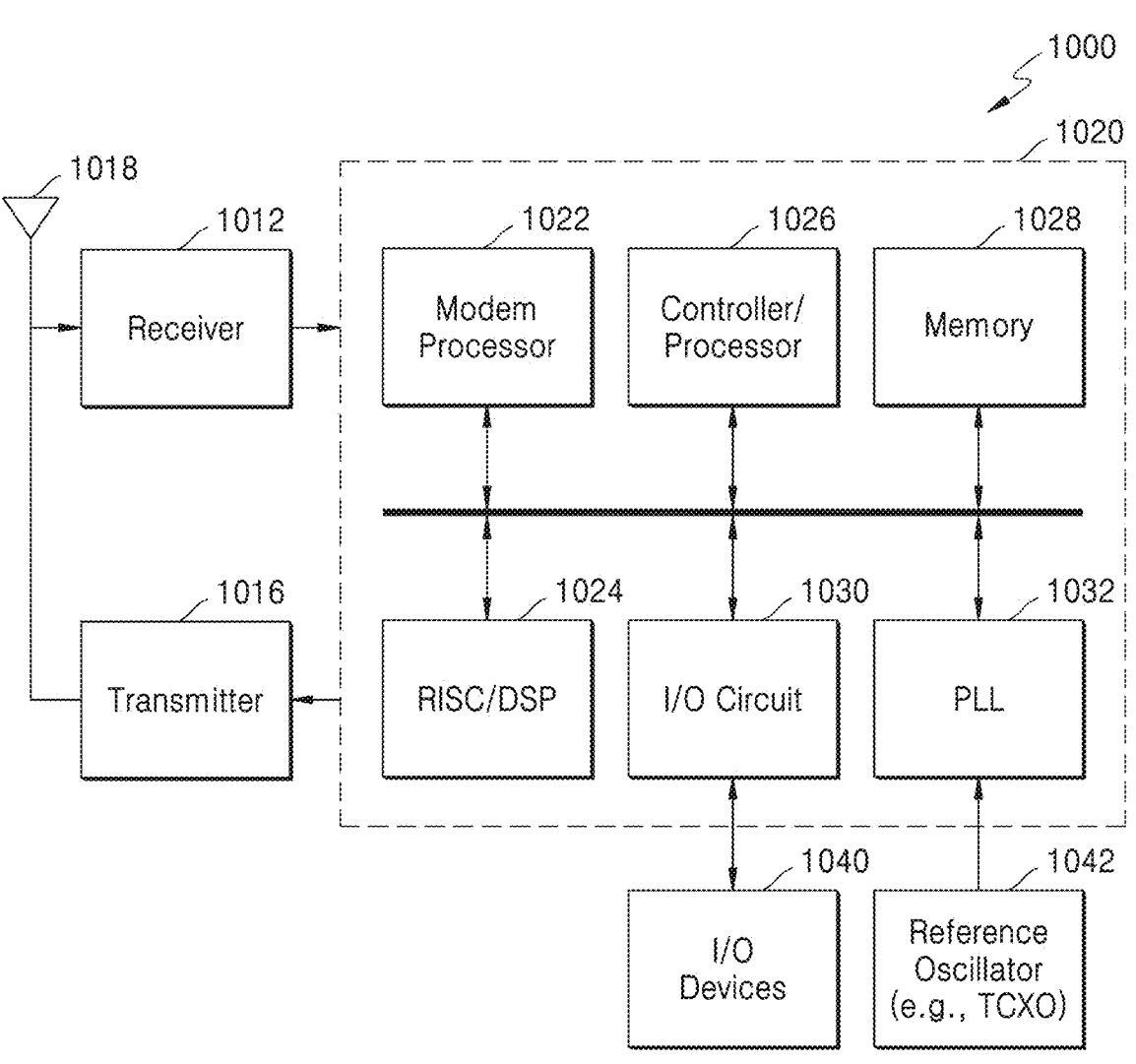
FIG. 9 is a block diagram of a communication device according to an embodiment.

FIG. 9 is a block diagram of a communication device 1000 according to an embodiment. FIG. 9 may be described with reference to FIG. 1, and redundant descriptions may be omitted.

Referring to FIG. 9, the communication device 1000 may include a receiver 1012, a transmitter 1016, a communication module 1020, an antenna 1018, an I/O device 1040, and a reference oscillator 1042. The receiver 1012 may include the ADC 10, shown in FIG. 1, which provides a more precise output signal (DOUT in FIG. 1). The receiver 1012 may convert the analog signal received from the outside through the antenna 1018 into a digital signal using the ADC 10 and then provide the signal to the communication module 1020. The transmitter 1016 may convert the digital signal received from the communication module 1020 into an analog signal and then output the signal to free space through the antenna 1018.

The communication module 1020 may include a modem processor 1022, RISC/DSP 1024, a controller/processor 1026, memory 1028, an I/O circuit 1030, and a phase locked loop 1032.

The modem processor 1022 may perform processing operations such as encoding, modulation, demodulation, and decoding for data transmission and data reception. The RISC/DSP 1024 may perform general or specialized processing operations in the communication device 1000. The controller/processor 1026 may control blocks within the communication module 1020. The memory 1028 may store data and various command codes. The I/O circuit 1030 may communicate with the I/O device 1040. The I/O circuit 1030 may convert the data signal received from the I/O device 1040 into a digital signal using the ADC 10 of FIG. 1. The phase locked loop 1032 may perform a frequency modulation operation using a frequency signal received from the reference oscillator 1042. The reference oscillator 1042 may be implemented as a crystal oscillator (XO), a voltage controlled crystal oscillator (VCXO), or a temperature compensated crystal oscillator (TCXO). The communication module 1020 may perform processing operations for communication using the output signal generated in the phase locked loop 1032.

Figure 10:
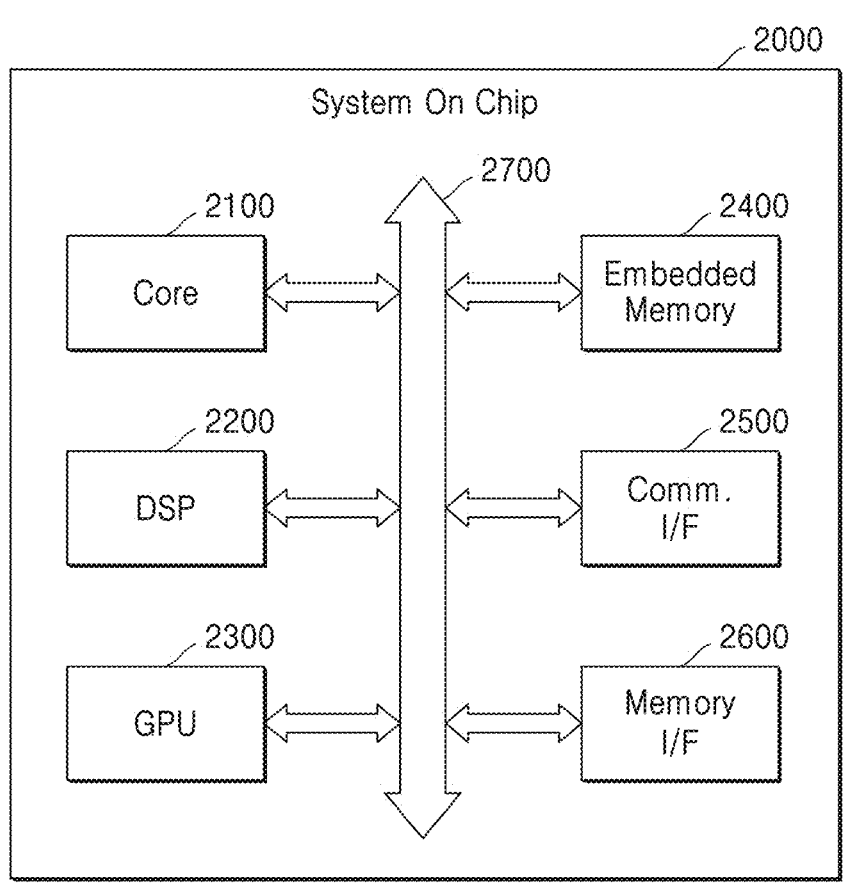
FIG. 10 is a block diagram of a system-on-chip according to an embodiment.

FIG. 10 is a block diagram of a system-on-chip 2000 according to an embodiment. FIG. 10 may be described with reference to FIG. 1, and redundant descriptions may be omitted.

Referring to FIG. 10, the system on chip (SoC) 2000 may refer to an integrated circuit that integrates components of a computing system or other electronic system. For example, an application processor (AP) as one of the SoC 2000 may include a processor and components for other functions.

The SoC 2000 may include a core 2100, a digital signal processor (DSP) 2200, a graphic processing unit (GPU) 2300, built-in memory 2400, a communication interface 2500, and a memory interface 2600. Components of the SoC 2000 may communicate with each other through a bus 2700.

The core 2100 may process instructions, and may control the operation of components included in the SoC 2000. For example, the core 2100 may drive an operating system and run applications on the operating system by processing a series of instructions. The DSP 2200 may generate useful data by processing digital signals, for example, digital signals provided from the communication interface 2500. The GPU 2300 may generate data for an image output through a display device from image data provided from the built-in memory 2400 or the memory interface 2600, and may encode the image data. The built-in memory 2400 may store data for operating the core 2100, the DSP 2200, and the GPU 2300. The memory interface 2600 may provide an interface to external memory of the SoC 2000, such as dynamic random access memory (DRAM) and flash memory.

The communication interface 2500 may provide serial communication with equipment outside of the SoC 2000. For example, the communication interface 2500 may be connected to Ethernet, and may include SerDes for serial communication.

The ADC 10 to which some embodiments are applied may be applied to the communication interface 2500 or the memory interface 2600. Specifically, through the ADC 10 which provides a more precise output signal (DOUT in FIG. 1), the communication interface 2500 or the memory interface 2600 may receive a data signal based on PAMn and convert the data signal into digital data in a manner according to some embodiments.

The bus 2700 may operate based on one of a variety of bus protocols. The variety of bus protocols may include at least one of advanced microcontroller bus architecture (AMBA) protocol, universal serial bus (USB) protocol, multimedia card (MMC) protocol, peripheral component interconnect (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, integrated drive electronics (IDE) protocol, mobile industry processor interface (MIPI) protocol, universal flash storage (UFS) protocol, and the like.

While the inventive concept has been particularly shown and described with reference to embodiments thereof, it will be understood that various changes in form and details may be made therein without departing from the spirit and scope of the following claims.

What is claimed is:

1. An analog-to-digital converter for converting an input signal into an output signal, the analog-to-digital converter comprising:

a digital-to-analog converter (DAC) configured to generate a first comparison voltage based on the input signal, a common mode voltage, a plurality of reference voltages, and a control signal;

a comparison circuit configured to output a first comparison result signal based on a result of comparing the first comparison voltage with a second comparison voltage; and a control circuit configured to generate the control signal based on the first comparison result signal and output the output signal, wherein the DAC comprises:

a correction circuit configured to generate a correction voltage by selectively switching switches connected to terminals to which the plurality of reference voltages are applied, based on a result of applying the common mode voltage to the comparison circuit, and to correct a voltage offset of the comparison circuit based on the correction voltage.

2. The analog-to-digital converter of claim 1, further comprising a voltage divider configured to generate the plurality of reference voltages based on at least one input reference voltage, and provide the plurality of generated reference voltages to the DAC.

3. The analog-to-digital converter of claim 1, wherein the correction circuit comprises:
   a capacitor array including first to $N^{th}$ capacitors, where N is an integer of 2 or more; and
   a switch array configured to select reference voltages respectively applied to the first to $N^{th}$ capacitors, based on the control signal.

4. The analog-to-digital converter of claim 3, wherein the correction circuit is configured to generate the correction voltage by sequentially switching switches connected to the first to $N^{th}$ capacitors, based on the control signal.

5. The analog-to-digital converter of claim 4, further comprising a voltage generator that generates the common mode voltage,
   wherein the voltage generator is configured to apply the common mode voltage as the first comparison voltage to the comparison circuit based on the control signal,
   the correction circuit is configured to generate a correction voltage by switching the switches to apply a first reference voltage to the first capacitor when the first comparison voltage is greater than the second comparison voltage, and
   the correction circuit is configured to generate the correction voltage by switching the switches to apply a second reference voltage to the first capacitor when the first comparison voltage is less than the second comparison voltage.

6. The analog-to-digital converter of claim 5, wherein the comparison circuit is configured to adjust the first comparison voltage by adding the correction voltage to the first comparison voltage.

7. The analog-to-digital converter of claim 6, wherein the correction circuit is configured to increase the correction voltage by switching the switches to apply a third reference voltage to the second capacitor when the adjusted first comparison voltage is greater than the second comparison voltage, and
   the correction circuit is configured to decrease the correction voltage by switching the switches to apply a fourth reference voltage to the second capacitor when the adjusted first comparison voltage is less than the second comparison voltage.

8. The analog-to-digital converter of claim 1, wherein a magnitude of the second comparison voltage is same as that of the common mode voltage.

9. The analog-to-digital converter of claim 1, wherein the plurality of reference voltages includes first to $M^{th}$ positive reference voltages (M is an integer of 2 or more) and first to $M^{th}$ negative reference voltages,
   wherein the first to $M^{th}$ positive reference voltages are configured to sequentially decrease by an exponential number of 2, and
   the first to $M^{th}$ negative reference voltages are configured to sequentially decrease by an exponential number of 2.

10. An offset correction method of an analog-to-digital converter, the method comprising:
   setting the analog-to-digital converter to correction mode;
   applying a common mode voltage to a comparison circuit;
   generating a control bit based on a result of the comparison circuit comparing a first comparison voltage with a second comparison voltage;
   based on a value of the control bit, determining reference voltages to be applied to a correction circuit, from among a plurality of candidate reference voltages;
   generating a correction voltage based on the determined reference voltages by the correction circuit; and
   correcting a voltage offset of the comparison circuit by adding the correction voltage to the first comparison voltage.

11. The method of claim 10, wherein the generating of the correction voltage comprises:
   generating a correction voltage by applying a first reference voltage to a first capacitor of the correction circuit when the first comparison voltage is greater than the second comparison voltage; and
   generating a correction voltage by applying a second reference voltage to the first capacitor when the first comparison voltage is less than the second comparison voltage.

12. The method of claim 11, wherein the correcting of the voltage offset of the comparison circuit by adding the correction voltage to the first comparison voltage comprises:
   adjusting the first comparison voltage by adding the correction voltage to the first comparison voltage;
   when the adjusted first comparison voltage is greater than the second comparison voltage, increasing the correction voltage by switching switches to apply a third reference voltage to the second capacitor of the correction circuit; and
   when the adjusted first comparison voltage is less than the second comparison voltage, decreasing the correction voltage by switching switches to apply a fourth reference voltage to the second capacitor.

13. An analog-to-digital converter (ADC) for converting an input signal into an output signal, the ADC comprising:
   a first digital-to-analog converter (DAC) configured to generate a first comparison voltage based on the input signal, a common mode voltage, a plurality of reference voltages, and a control signal;
   a second DAC configured to generate a second comparison voltage based on the common mode voltage, the plurality of reference voltages, and the control signal;
   a third DAC configured to generate a third comparison voltage based on the common mode voltage, the plurality of reference voltages, and the control signal;
   a first comparison circuit configured to output a first comparison result signal based on a result of comparing the first comparison voltage with the second comparison voltage;
   a second comparison circuit configured to output a second comparison result signal based on a result of comparing the first comparison voltage with a fourth comparison voltage; and
   a third comparison circuit configured to output a third comparison result signal based on a result of comparing the first comparison voltage with the third comparison voltage,
   wherein the first DAC comprises:
   a first correction circuit configured to correct respective voltage offsets of the first comparison circuit, the second comparison circuit, and the third comparison circuit based on a result of applying the common mode voltage to the first comparison circuit,
   the second DAC comprises:

a second correction circuit configured to correct the voltage offset of the second comparison circuit based on a result of applying the common mode voltage to the first comparison circuit, and the third DAC comprises:

a third correction circuit configured to correct the voltage offset of the third comparison circuit based on a result of applying the common mode voltage to the third comparison circuit.

14. The analog-to-digital converter of claim 13, further comprising a control circuit configured to generate the control signal, control the first to third DACs based on the first to third comparison result signals, and output the output signal.

15. The analog-to-digital converter of claim 14, further comprising a voltage divider configured to generate the plurality of reference voltages based on at least one input reference voltage, and provide the plurality of generated reference voltages to the first DAC, the second DAC, and the third DAC.

16. The analog-to-digital converter of claim 13, wherein the first correction circuit comprises:

a first capacitor array including a plurality of capacitors; and a first switch array configured to select reference voltages respectively applied to the plurality of capacitors included in the first capacitor array based on the control signal, wherein the second correction circuit comprises:

a second capacitor array including a plurality of capacitors; and a second switch array configured to select reference voltages respectively applied to the plurality of capacitors included in the second capacitor array based on the control signal, wherein the third correction circuit comprises:

a third capacitor array including a plurality of capacitors; and a third switch array configured to select reference voltages respectively applied to the plurality of capacitors included in the second capacitor array based on the control signal.

17. The analog-to-digital converter of claim 16, wherein the first correction circuit is configured to generate a first correction voltage by selectively switching switches connected to terminals to which the plurality of reference voltages are applied, and correct voltage offsets of the first comparison circuit, the second comparison circuit, and the third comparison circuit by adding the first correction voltage to the first comparison voltage, the second comparison voltage, and the third comparison voltage, wherein the second correction circuit is configured to generate a second correction voltage by selectively switching switches connected to terminals to which the plurality of reference voltages are applied, and correct the voltage offset of the first comparison circuit by adding the second correction voltage to the second comparison voltage, wherein the third correction circuit is configured to generate a third correction voltage by selectively switching switches connected to terminals to which the plurality of reference voltages are applied, and correct the voltage offset of the third comparison circuit by adding the third correction voltage to the third comparison voltage.

18. The analog-to-digital converter of claim 13, wherein the first comparison circuit is configured to generate a control bit having a first value when the first comparison voltage is greater than the second comparison voltage, and generate a control bit having a second value when the second comparison voltage is greater than the first comparison voltage, wherein the second comparison circuit is configured to generate a control bit having a first value when the first comparison voltage is greater than the fourth comparison voltage, and generate a control bit having a second value when the fourth comparison voltage is greater than the first comparison voltage, wherein the third comparison circuit is configured to generate a control bit having a first value when the first comparison voltage is greater than the third comparison voltage, and generate a control bit having a second value when the third comparison voltage is greater than the first comparison voltage.

19. The analog-to-digital converter of claim 16, wherein the first correction circuit is configured to cause the first comparison circuit to generate the first comparison result signal comprising a plurality of control bits by sequentially switching switches included in the first switch array based on the control signal, wherein the second correction circuit is configured to cause the second comparison circuit to generate the second comparison result signal comprising a plurality of control bits by sequentially switching switches included in the second switch array based on the control signal, wherein the third correction circuit is configured to cause the third comparison circuit to generate the third comparison result signal comprising a plurality of control bits by sequentially switching switches included in the third switch array based on the control signal.

20. The analog-to-digital converter of claim 13, wherein the plurality of reference voltages include first to $M^{th}$ positive reference voltages, where M is an integer of 2 or more, and first to $M^{th}$ negative reference voltages, wherein the first to $M^{th}$ positive reference voltages are configured to sequentially decrease by an exponential number of 2, and the first to $M^{th}$ negative reference voltages are configured to sequentially decrease by an exponential number of 2.

* * * * *